(12) United States Patent
Langhammer et al.

(10) Patent No.: US 6,987,401 B1
(45) Date of Patent: Jan. 17, 2006

(54) COMPARE, SELECT, SORT, AND MEDIAN-FILTER APPARATUS IN PROGRAMMABLE LOGIC DEVICES AND ASSOCIATED METHODS

(75) Inventors: Martin Langhammer, Sandbanks (GB); Jonah Graham, High Wycombe (GB)

(73) Assignee: Altera Corporation, San Jose, CA (US)

( * ) Notice: Subject to any disclaimer, the term of this patent is extended or adjusted under 35 U.S.C. 154(b) by 112 days.

(21) Appl. No.: 10/277,627

(22) Filed: Oct. 22, 2002

(51) Int. Cl.
*H03K 19/177* (2006.01)

(52) U.S. Cl. ............................. 326/40; 326/38; 326/46
(58) Field of Classification Search .............. 326/37–47
See application file for complete search history.

(56) References Cited

U.S. PATENT DOCUMENTS

| | | | | |
|---|---|---|---|---|
| 5,408,675 A | * | 4/1995 | Florentino et al. | 345/800 |
| 5,532,948 A | * | 7/1996 | Kohno et al. | 708/207 |
| 5,900,006 A | * | 5/1999 | Yoon | 708/202 |

OTHER PUBLICATIONS

Copending U.S. Appl. No. 10/212,487, filed Aug. 5, 2002, "Method And Apparatus For Implementing A Viterbi Decoder," (ALT.P004).

Copending U.S. Appl. No. 10/331,707, filed Dec. 30, 2002, "Method And Apparatus For Implementing A Multiple Constraint Length Viterbi Decoder," (ALT.P013).
John Smith, "Implementing Median Filters In XC4000E PFGAs," Design Hints and Issues, Xilinx, (available on the Internet before the filing of the present patent application), 1 pg., no date.
Altera, Apex 20K, "Programmable Logic Device Family," Data Sheet, Ver. 4,3, Feb. 2002, pp. 1–116.
Altera, Apex 20KC, "Programmable Logic Device," Data Sheet, Ver. 2.1, Apr. 2002, pp. 1–87.

\* cited by examiner

*Primary Examiner*—Anh Q. Tran
(74) *Attorney, Agent, or Firm*—O'Keefe, Egan & Peterman, LLP

(57) ABSTRACT

A programmable logic device (PLD) includes a compare-select circuitry. The compare-select circuitry includes logic elements 1 through N. Each logic element comprises a compare circuitry and a selector circuitry. The compare circuitry compares two inputs of the logic element and generates a compare output signal of the logic element. The selector circuitry provides one of the two inputs of the logic element as an output in response to a selection signal. The selection signal for all logic elements (i.e., logic elements 1 through N) constitutes the compare output signal of the Nth logic element. A median-calculation apparatus is also disclosed. The median-filter apparatus includes at least one insertion-sort circuitry. The at least one insertion-sort circuitry performs insertion-sorting of a set of input numbers corresponding to that insertion-sort circuitry to generate a corresponding set of sorted numbers. Each of the sorted set of numbers includes a median value of the corresponding set of input numbers.

39 Claims, 16 Drawing Sheets

COMPARE, SELECT, SORT, AND MEDIAN-FILTER APPARATUS IN PROGRAMMABLE LOGIC DEVICES AND ASSOCIATED METHODS

TECHNICAL FIELD

This patent application relates generally to logic circuitry and programmable logic devices (PLDs) and, more particularly, to compare, select, sort, and median-filter circuitry and associated methods.

BACKGROUND

PLDs have increasingly proliferated in many areas of technology, such as data processing and signal processing applications. The inherent flexibility of the PLD and the ability to re-configure the PLD have in part led to their popularity. System designers and even system end-users can program the PLDs and reconfigure the functionality of part or all of the system. Re-configuring the system avoids costly and time-consuming re-design of the system or its various components or sub-systems.

Data and signal processing applications often entail operations on numbers. One typical operation involves comparing or sorting numbers and selecting one or more numbers or data according to prescribed criteria. Many data signal processing applications, for example, median filtering applications, use compare or sort and select operations. Conventional or brute-force implementation of compare, sort, and median filtering in a PLD may use the PLD resources inefficiently. As a consequence, the system cost and complexity may increase.

Furthermore, an inefficient implementation may fail to respond in a relatively short period of time and with adequate throughput, for example, in real-time applications. A need exists for compare, sort, and median filtering circuitry and methods that make efficient use of PLD resources.

SUMMARY

This invention in part relates to compare, select, and sort apparatus and associated methods. One aspect of the invention relates to compare-select apparatus. In one embodiment, a PLD according to the invention includes a compare-select circuitry. The compare-select circuitry has first through Nth logic elements. Each logic element in the compare-select circuitry includes a compare circuitry and a selector circuitry. The compare circuitry compares first and second inputs of the logic element and generates a compare output signal of the logic element. Based on a selection signal, the selector circuitry provides one of the first and second inputs of the logic element as an output of the selector circuitry. The selection signal for the first through Nth logic elements constitutes the compare output signal of the Nth logic element.

In another embodiment, a PLD according to the invention includes an insertion-sort circuitry. The insertion-sort circuitry includes first through Kth compare-select circuitries coupled to form the insertion-sort circuitry. Each compare-select circuitry has a first output. In response to an application of a stimulus signal, the first outputs of the first through Kth compare-select circuitries are sorted.

Another aspect of the invention relates to methods for comparing, selecting, and sorting. In one embodiment, a method of processing information in a PLD includes accepting first and second numbers as inputs to the PLD. The method further includes using first through Nth logic elements included within the PLD to compare the first and second numbers, and to generate a compare signal in each of the logic elements based on comparing the first and second numbers. The method also entails using the compare signal of the Nth logic element in each of the first through Nth logic elements to select one of the first and second numbers to generate a selected number, and providing the selected number.

In another embodiment, a method of sorting numbers within a PLD includes providing an insertion-sorter by coupling together first through Kth compare-select circuitries implemented in the PLD. Each compare-select circuitry has a first output that represents a number. The method also includes using the first through Kth compare-select circuitries to sort the numbers represented by the first outputs of the compare-select circuitries.

Furthermore, the invention relates in part to median filtering of data, such as image data. One aspect of the invention relates to calculating median values of a set of numbers or data points. In one embodiment, a median-calculation apparatus according to the invention includes at least one insertion-sort circuitry. The insertion-sort circuitry insertion-sort or insertion-sorts a corresponding set of input numbers and provides a corresponding sorted set of numbers. Each of the sorted set of numbers includes a median value of the corresponding set of input numbers.

Another aspect of the invention relates to median-filter apparatus. In one embodiment, a median-filter apparatus includes a PLD. The PLD includes at least one insertion-sort circuitry. The insertion-sort circuitry operates or operate in response to a first clock signal that has a first frequency. Each insertion-sort circuitry (if more than one used) insertion-sorts a corresponding set of input numbers to provide a sorted set of numbers.

Another aspect of the invention relates to methods for processing and sorting numbers. In one embodiment, a method according to the invention includes accepting at least one set of input numbers. The method also includes using at least one insertion-sort circuitry to insertion-sort a corresponding set in the at least one set of input numbers, and to generate a corresponding sorted set of numbers. Each of the sorted set of numbers includes a median value of the corresponding set of input numbers.

Another aspect of the invention relates to methods for median filtering of data. In one embodiment, a method according to the invention of median filtering an array of numbers includes using at least one insertion-sort circuitry adapted for insertion-sorting a corresponding set of input numbers within the array of numbers, to provide a sorted set of numbers. The insertion-sort circuitry operate or operates in response to a first clock signal that has a first frequency. Each insertion-sort circuitry is implemented in a PLD.

DESCRIPTION OF THE DRAWINGS

The appended drawings illustrate only exemplary embodiments of the invention and therefore should not be considered as limiting its scope. The disclosed inventive concepts lend themselves to other equally effective embodiments. In the drawings, the same numeral designators used in more than one drawing denote the same, similar, or equivalent functionality, components, or blocks.

DETAILED DESCRIPTION

This invention contemplates compare, select, and sort operations using PLDs in a variety of signal and data processing applications, such as median filtering. By implementing compare, select, sort, and median-filter circuitry in a PLD, one may take advantage of the re-configurable resources of the PLD and thus increase system flexibility and utility. By using PLD resources efficiently, the inventive concepts disclosed here provide compare, select, and sort operations that in exemplary embodiments allow real-time median filtering in image-processing applications.

Generally, compare, select, and sort operations perform the well-known mathematical operations of comparing a set of numbers, selecting one or more numbers from the set, and sorting the set of numbers. Median filtering typically replaces a number or value in a set of numbers with a median of a subset of the set of numbers. For example, in image processing applications, median filtering replaces the value representing a particular pixel with a median of a set of numbers. The set of numbers typically includes the values corresponding to that particular pixel and a set of other pixels, such as some of the surrounding pixels.

Figure 1:
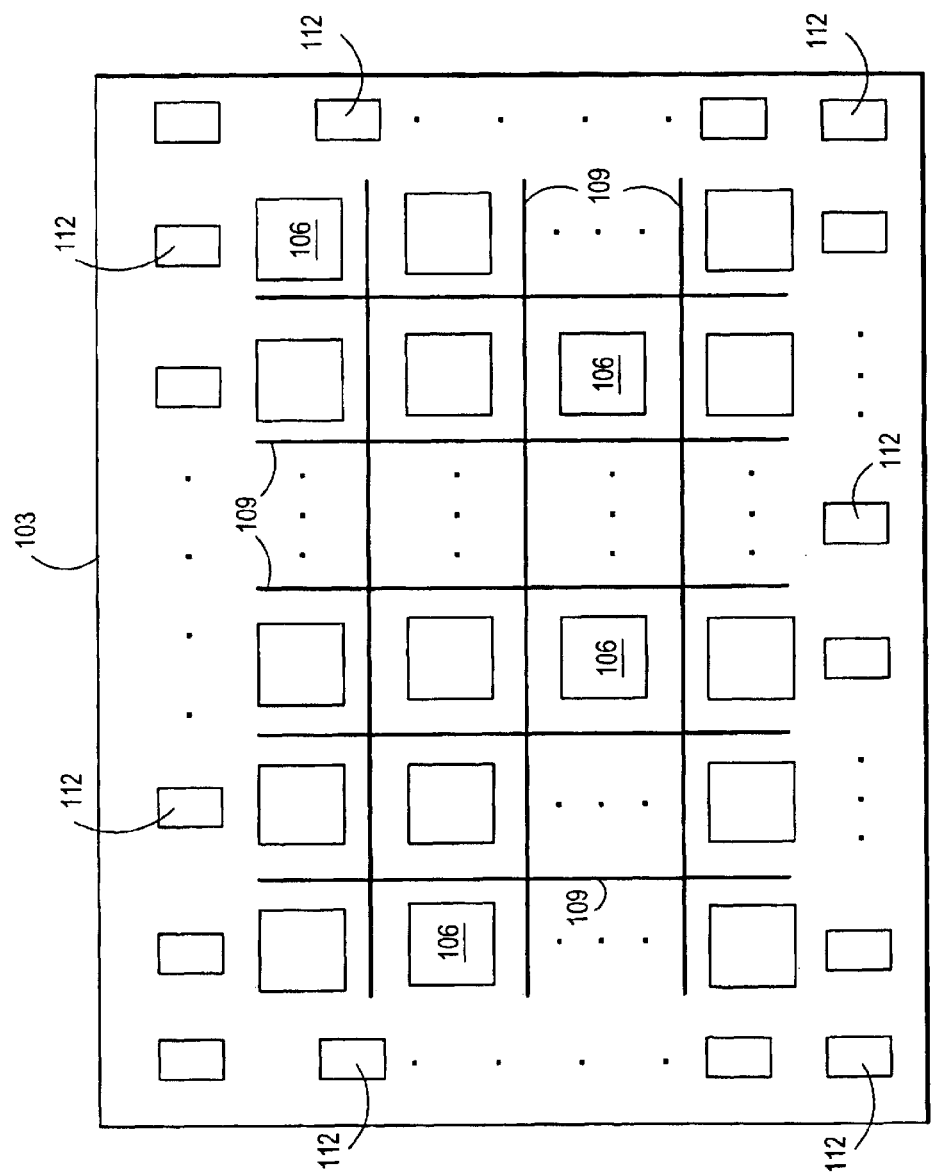
FIG. 1 shows a block diagram of a PLD according to the invention, which may include compare-select circuitry, insertion-sort circuitry, and/or median-filter circuitry.

FIG. 1 shows a block diagram of a PLD 103 according to the invention. PLD 103 includes programmable logic 106 and global programmable interconnect 109. In addition, PLD 103 may include compare-select circuitry, insertion-sort circuitry, and/or median-filter circuitry (not shown explicitly), as described below in detail. Note that PLD 103 may include other arrangements and numbers of programmable logic 106 and global programmable interconnect 109, as desired. For example, global interconnect 109 may include a plurality of interconnect segments that in turn couple to one another.

Programmable logic 106 may include a variety of configurable logic, such as gates, look-up tables (LUT), multiplexers (MUX), etc., as desired. Generally, programmable logic 106 may also include other circuitry (not shown explicitly), such as product term circuitry and memory. PLD 103 may include blocks of memory known by various names in the art, such as embedded system block (ESB), as desired. The blocks of memory may couple to programmable logic 106 and may reside within programmable logic 106, as desired.

Global programmable interconnect 109 couples the various blocks of programmable logic 106 to one another and to other circuitry (not shown explicitly) outside PLD 103, as desired. Circuitry within PLD 103 (e.g., programmable logic 106 or global programmable interconnect 109) may communicate with circuitry external to PLD 103 via input/output (I/O) circuitry 112. Generally, PLD 103 may have the structure and include circuitry known to persons of ordinary skill in the art who have the benefit of the description of the invention.

In exemplary embodiments according to the invention, PLD 103 may have a hierarchical architecture. Each block of programmable logic 106 may include blocks of configurable or programmable logic, coupled together (and to global programmable interconnect 109) with local programmable interconnect. The hierarchical architecture may repeat (i.e., other levels of programmable logic and/or programmable interconnect may nest within programmable logic 106, etc.).

Global interconnect 109, as well other levels of interconnect, such as local interconnect, may have a grid structure, as desired. The grid structure may include horizontal, vertical, and/or diagonal interconnects or interconnect segments, as persons skilled in the art with the benefit of the description of the invention understand. Through the grid structure, various parts of PLD 103 may communicate with one another, with external circuitry, or both, as desired.

At some level, PLD 103 includes a plurality of blocks of programmable logic circuitry (not shown explicitly), known by various names, such as logic blocks or logic elements (LEs). Clusters of LEs may form larger blocks of programmable logic circuitry, known as logic array blocks (LABs) or by other names within the art. The LEs couple to each other, to higher-level circuitry (e.g., LABs), or both, using local interconnect circuitry (not shown explicitly). The LEs typically may include various blocks of logic, such as MUX, LUT, flip-flops, registers, gates, etc.

Figure 2:
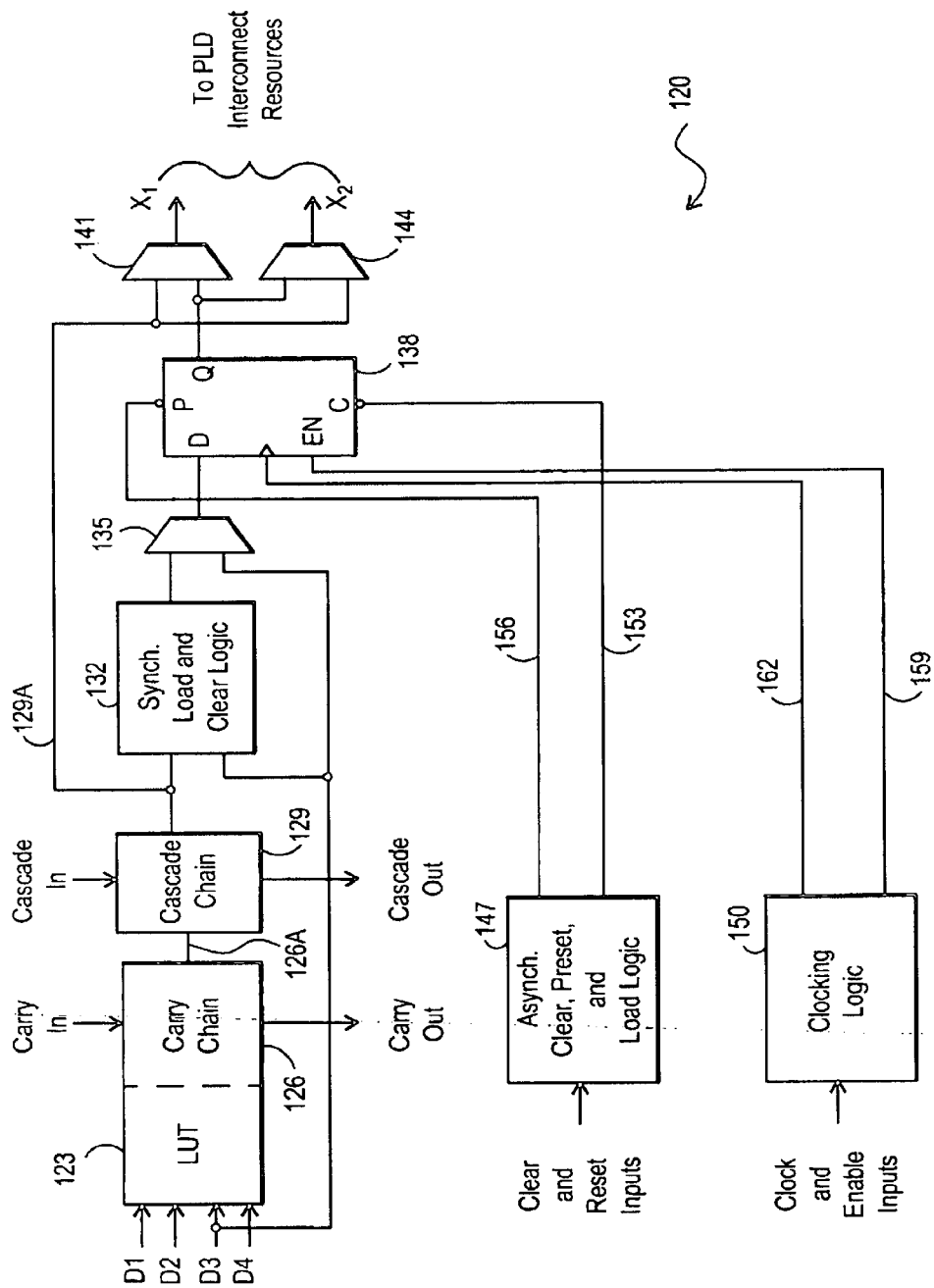
FIG. 2 illustrates a block diagram of a logic element in PLDs used in exemplary embodiments according to the invention.

FIG. 2 illustrates a block diagram of an LE 120 in PLDs used in exemplary embodiments according to the invention. For example, PLD 103 may include LE 120. Generally, LE 120 includes logic circuitry that operate on input $D_1$–$D_4$ to produce outputs $X_1$ and $X_2$, as well as clocking and register control circuitry.

The logic circuitry within LE 120 includes LUT 123. LUT 123 accepts inputs $D_1$–$D_4$. The user may program LUT 123 to perform desired logic operations on inputs $D_1$–$D_4$. In other words, LUT 123 serves as a function generator that can implement a desired function of four binary variables.

LE 120 also includes register 138. The user may program register 138 as D, T, JK, or SR operation. Using MUX 141 and MUX 144, the user may provide as outputs $X_1$ and $X_2$ output Q of register 138. For combinatorial functions, the user may use MUX 141 and MUX 144 to bypass register 138, as desired. In that case, signals originating from LUT 123 (coupled through carry chain circuitry 126 and cascade chain circuitry 129 and output signal 129A) may drive outputs $X_1$ and $X_2$ of LE 120.

Note that, by controlling or programming MUX 141 and MUX 144, the user may drive outputs $X_1$ and $X_2$ independently of each other. In other words, output $X_1$ may provide output of LUT 123, whereas output $X_2$ may supply output Q of register 138, and vice-versa, as desired. Consequently, the user may use LUT 123 and register 138 to perform unrelated functions.

LUT 123 couples to, and operates in cooperation with, carry chain circuitry 126 and cascade chain circuitry 129. Using carry chain circuitry 126 and cascade chain circuitry 129, LE 120 may couple to adjacent LEs without using local interconnect paths. Carry chain circuitry 126 accepts a Carry In signal from a lower-order bit and generates a Carry Out signal for a higher-order bit.

Carry chain circuitry 126 supports arithmetic functions, such as counters, subtracters, and adders. Cascade chain circuitry 129 can implement wide-input (inputs with relatively high fan-in), for example, equality comparators. Adjacent LUTs can compute portions of a function in parallel, and cascade chain circuitry 129 can serially couple the intermediate values.

Output signal 129A couples to synchronous load and clear logic circuitry 132. Through MUX 135, load and clear logic circuitry 132 drives the D input of register 138. Output signal 129A also couples to MUX 141 and MUX 144, thus enabling the user to drive outputs $X_1$ and $X_2$ of LE 120 without routing signal 129A through register 138. In that manner, the user can bypass register 138 and drive the outputs $X_1$ and $X_2$ of LE 120 directly through MUX 141 and MUX 144.

LE 120 also includes asynchronous clear, preset, and load logic circuitry 147. In response to clear and reset inputs, clear, preset, and load logic circuitry 147 generates clear signal 153 and preset signal 156. Clear signal 153 and preset signal 156 drive the clear and preset inputs of register 138, respectively. LE 120 supports an asynchronous clear function.

Clocking logic circuitry 150 accepts clock and clock enable inputs. In response to those inputs, clocking logic circuitry 150 generates enable signal 159 and clock signal 162. Enable signal 159 and clock signal 162 drive the enable and clock inputs of register 138, respectively.

LE 120 supports a multitude of operating modes. A first operating mode of LE 120 (also known as the normal mode) is suitable for general logic applications, such as combinatorial functions or wide decoding functions that can take advantage of cascade chain circuitry 129. In this mode, LUT 123 functions as a 4-input LUT. Inputs $D_1$–$D_4$ and the input carry drive the four inputs of LUT 123 and the Carry In input of carry chain circuitry 126, respectively. One may combine the output of LUT 123 with the Cascade In input to LE 120 to form a cascade chain through the Cascade Out output.

One may use a second operating mode (also known as the arithmetic mode), to implement adders, accumulators, and comparators, as desired. LE 120 in the second mode uses LUT 123 configured as two 3-input LUTs. The first 3-input LUT computes a three-input function to generate a combinatorial or registered output. The inputs to the first LUT constitute two of inputs $D_1$–$D_4$ and the Carry In input.

The other 3-input LUT uses the same three input signals to generate the Carry Out signal, thus creating a carry chain. This mode also supports simultaneous use of the cascade chain feature. LE 120 operating in this mode may drive registered or unregistered versions of the output of the first 3-input LUT, as desired.

LE 120 also supports a third mode of operation (also known as the counter mode of operation). This mode offers clock enable, counter enable, synchronous up/down control, synchronous clear, and synchronous load options. LE 120 generates the counter enable and the synchronous up/down control signals from the four input signals, $D_1$–$D_4$. Similar to the second mode, in the third mode, LE 120 uses LUT 123 configured as two 3-input LUTs. The first 3-input LUT accepts two of inputs $D_1$–$D_4$ and either the Carry In input or the Q output of register 138 (selected through a MUX not shown in FIG. 2). The other 3-input LUT accepts the same three signals as the first LUT to generate the Carry Out signal.

A data sheet, *APEX 20K Programmable Logic Device Family* (February 2002), produced by Altera Corporation, the assignee of the present patent application, provides further details of the various circuitry described above and used in exemplary embodiments according to the invention. Such circuitry includes PLD 103 generally, programmable logic 106, global programmable interconnect 109, LE 120, etc. Note, however, that one may effectively apply the inventive concepts to other embodiments of those circuits and blocks, as well as to other PLDs made by Altera, Xilinx, Inc., or other vendors, by making modifications that fall within the knowledge of persons of ordinary skill in the art who have the benefit of the description of the invention.

One aspect of the invention relates to compare-select and insertion-sort circuitry in PLDs. Exemplary embodiments according to the invention use multiple instances of LE 120, as described below. Note that, to help facilitate and clarify presentation of the embodiments described below, the figures and the corresponding text may not include all of the blocks present within the LEs.

Figure 3:
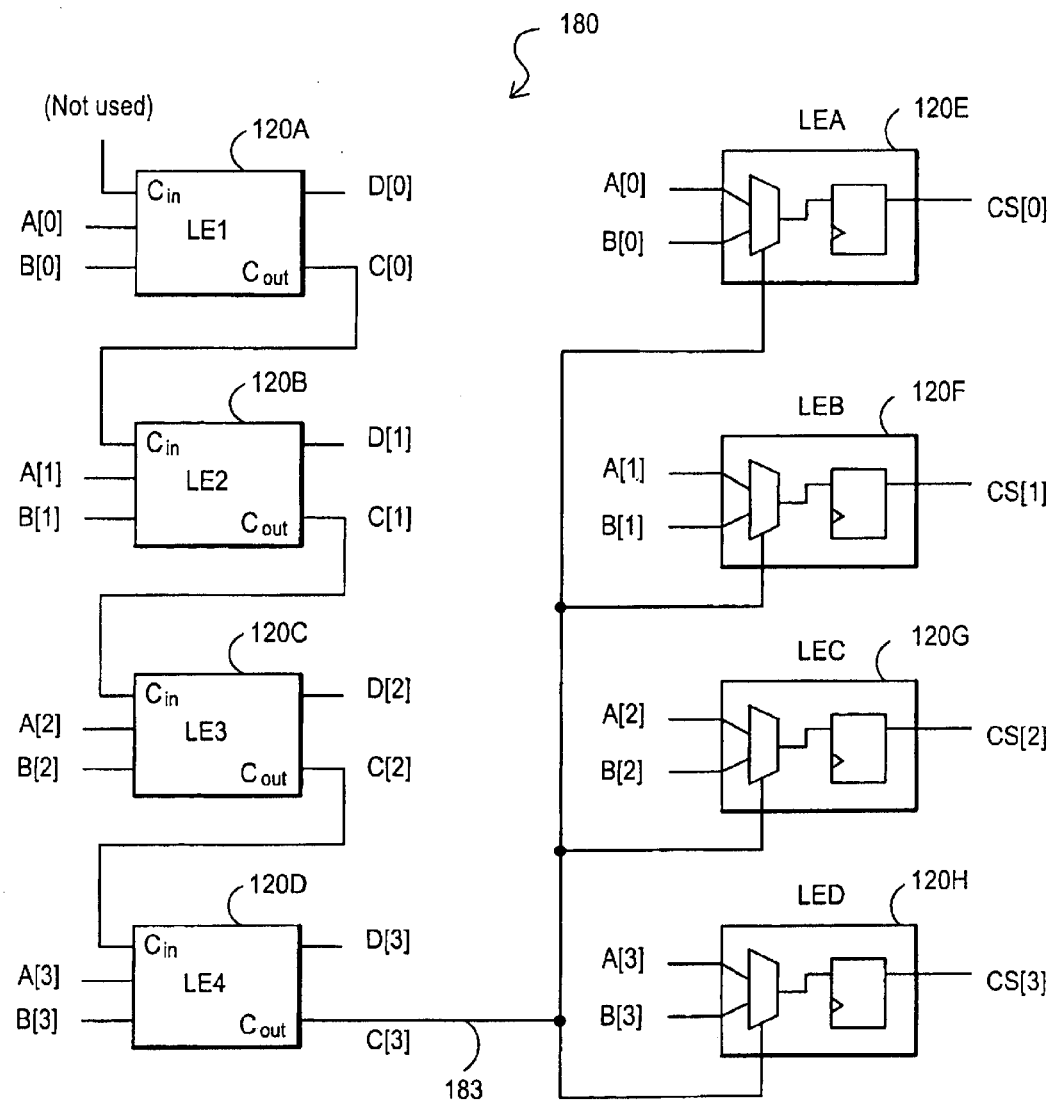
FIG. 3 depicts a block diagram of an exemplary embodiment of a compare-select circuitry according to the invention.

FIG. 3 depicts a block diagram of an exemplary embodiment of a compare-select circuitry 180 that uses eight LEs 120A–120H. LEs 120A–120D operate in the second operating mode (arithmetic mode). In other words, each of LEs 120A–120D implements two 3-input LUTs.

Compare-select circuitry 180 accepts two 4-bit inputs, A and B. Inputs A and B include bits A[0] through A[3] and B[0] through B[3], respectively. The inventive concepts and circuitry described here, however, are flexible and general in nature and lend themselves to other sizes and widths of inputs, as desired. The choice of the width of inputs depends on the design and performance specifications for a particular application, as persons of ordinary skill in the art who have the benefit of the description of the invention understand.

Each bit of the inputs A and B feeds a respective one of LEs 120A–120D. LEs 120A–120D function as subtracter circuits. In other words, LEs 120A–120D subtract input B from input A (e.g., LE 120A subtracts bit B[0] from bit A[0], LE 120B subtracts bit B[1] from bit A[1], and so on). As a consequence of the subtraction, each of LEs 120A–120D generates a carry. The carry signals propagate through the LEs as follows.

The Carry Out output of the first LE feeds the Carry In input of the second LE, and so on, to a desired number, say, N, LEs, where N denotes a positive integer. For example, the Carry Out output of LE 120A feeds the Carry In input of LE 120B. As another example, the Carry Out output of LE 120B drives the Carry In input of LE 120C, and so on. As persons skilled in the art with the benefit of the description of the invention understand, one may extend this arrangement to a desired number of LEs, say, N LEs. The Carry In input of LE 120A is a "don't care" input (i.e., its logical value does not affect the result that circuitry 180 generates).

One of the two 3-input LUTs in each of LEs 120A–120D performs the subtraction described above. Compare-select circuitry 180 does not use either the remaining 3-input LUT in each of LEs 120A–120D, nor does it employ the results of the respective bit subtraction operations (labeled as D[0]–D[3]).

Inputs A and B also drive the inputs of LEs 120E–120H. Depending on select signal 183, each of LEs 120E–120H couples one bit of either input A or input B to a respective one of the four outputs (labeled as CS[0] through CS[3]) of circuitry 180. The Carry Out output of the fourth LE (LE 120D) serves as select signal 183. Thus, depending on the relative magnitudes of inputs A and B, select signal 183 causes the selection of the larger input and the coupling of that input to outputs CS[0]–CS[3] through a MUX (each implemented by using the 4-input LUT in a corresponding one of LEs 120E–120H) and register (corresponding to register 138 in LE 120 of FIG. 2) in each of LEs 120E–120H.

Note that, by making modifications that fall within the knowledge of persons of ordinary skill in the art who have the benefit of the description of the invention, select signal 183 may cause the selection of the smaller, rather than larger, input, as desired. Select signal 183 may also cause the coupling of that input to outputs CS[0]–CS[3] in a manner similar to that described above.

Note that compare-select circuitry 180 uses 8 LEs. In general, for N-bit inputs, circuitry 180 uses 2N LEs. Furthermore, for 4-bit inputs, circuitry 180 employs five 4-bit buses (2 buses at the inputs to LEs 120A–120D, 2 buses at the inputs to LEs 120E–120H, and one output bus). By making certain modifications in the circuitry as described below, one may optimize circuitry 180 and thus allow for more efficient use of PLD resources.

Figure 4:
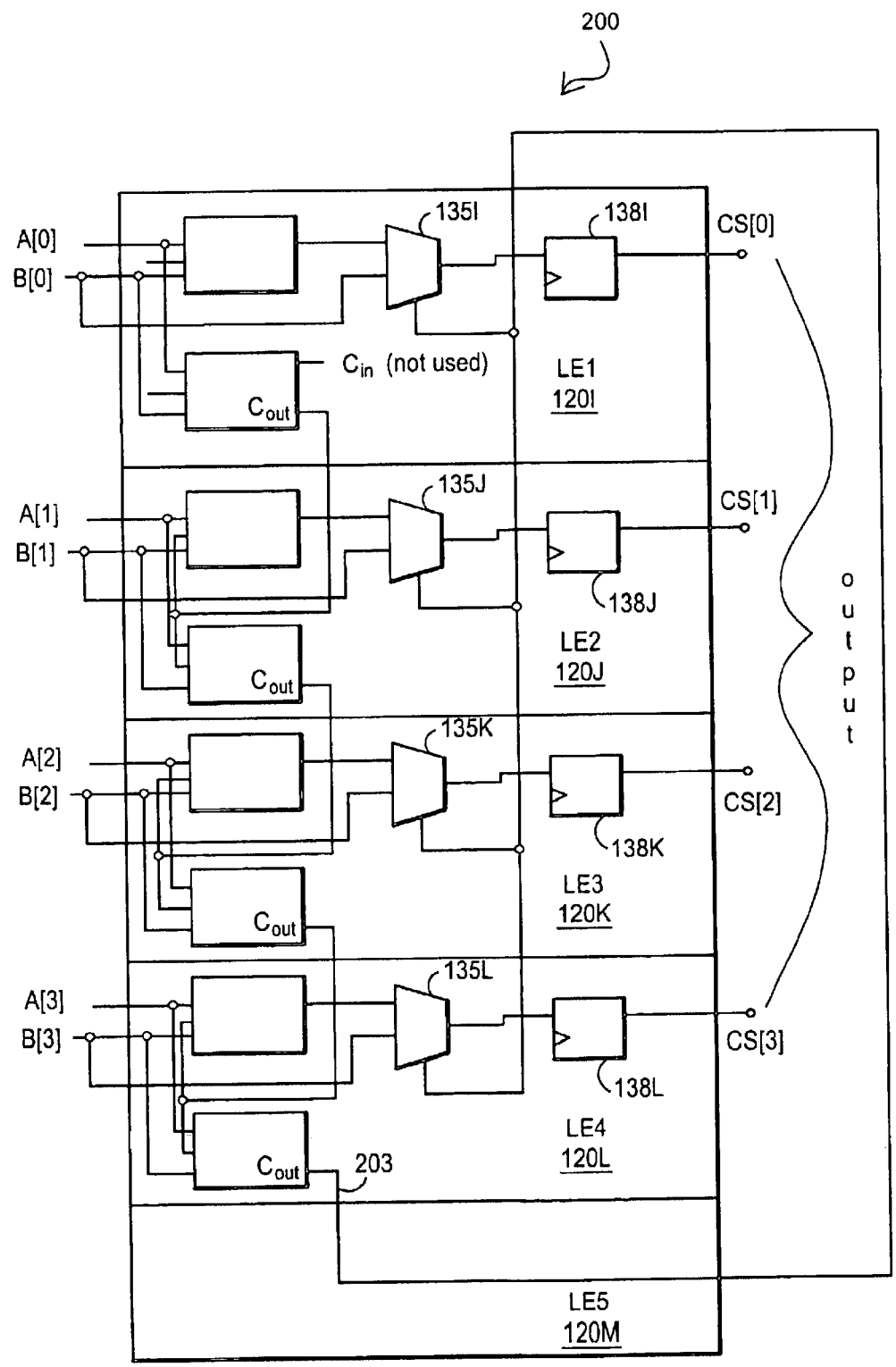
FIG. 4 shows an exemplary embodiment according to the invention of a more optimal compare-select circuitry.

FIG. 4 shows an exemplary embodiment according to the invention of a more optimal compare-select circuitry 200. For 4-bit inputs A and B, compare-select circuitry 200 includes 5 LEs 120I–120M. As noted above, compare-select circuitry 180 in FIG. 3 includes 8 LEs. Thus, compared to compare-select circuitry 180, compare-select circuitry 200 represents a 37.5% reduction in the number of LEs used.

LEs 120I–120M in compare-select circuitry 200 operate in the third mode (counter mode). Rather than implementing a counter circuit, however, LEs 120I–120L provide a more optimal compare-select circuitry. As noted above, in the third mode of operation, each of LEs 120I–120L includes two 3-input LUTs. Unused inputs of the LUTs constitute "don't care" inputs.

The first LUT in each of LEs 120I–120L simply couples the corresponding bit of input A to its output. For example, the first LUT in LE 120J couples A[1] to its output, which in turn couples to MUX 135J. Each bit of input B also couples to the corresponding one of MUXs 135I–135L. For instance, B[2] couples to MUX 135K, etc.

The second 3-input LUT in each of LEs 120I–120L accepts corresponding bits of inputs A and B and the Carry Out output from a preceding LE. The Carry Out output of LE 120L serves as a select signal 203 for MUXs 135I–135L. Depending on the value of select signal 203 (i.e., which of the inputs A and B has a higher value), MUXs 135I–135L couple either input A or input B to a corresponding input D of one of registers 138I–138L in LEs 120I–120L. The outputs Q of registers 138I–138L constitute the outputs CS[0]–CS[3] of compare-select circuitry 200.

Note that, rather than coupling input B to MUXs 135I–135L, one may use a new input, C (not shown explicitly). In other words, each of MUXs 135I–135L accepts as inputs the output of a corresponding one of the 3-input LUTs and a corresponding bit of input C. By doing so, one may extend the functionality of compare-select circuitry 200, as desired. Rather than selecting input A or input B, a compare-select circuitry with the extended functionality may select either input A or input C, depending on the relative values of inputs A and B.

LE 120M accepts the Carry Out output of LE 120L (i.e., select signal 203) and, using the interconnect resources of the PLD, couples that signal to MUXs 135I–135L. Note that, depending on the specific structure, circuitry, and interconnect resources present within a PLD, however, one may route select signal 203 directly to LEs 120I–120L, as desired.

Generally, for N-bit inputs A and B, compare-select circuitry 200 uses (N+1) LEs. In comparison, for N-bit inputs A and B, compare-select circuitry 180 of FIG. 3 employs 2N LEs. Thus, using the more optimal compare-select circuitry 200 results in the savings of (N−1) LEs. Consequently, one may implement compare-select circuitry 200 by using PLD resources more efficiently and, hence, decreasing the overall system complexity and cost.

Note that in compare-select circuitry 180 and compare-select circuitry 200, the selection criterion constitutes the relative values of inputs A and B. Broadly speaking, however, one may implement an extended compare-select circuitry that uses more generalized selection criteria. The selection criteria may, for example, depend on the relative values of inputs A and B as well as a desired or prescribed function, f, of one or more inputs (A and/or B and/or additional general input signals).

Figure 5:
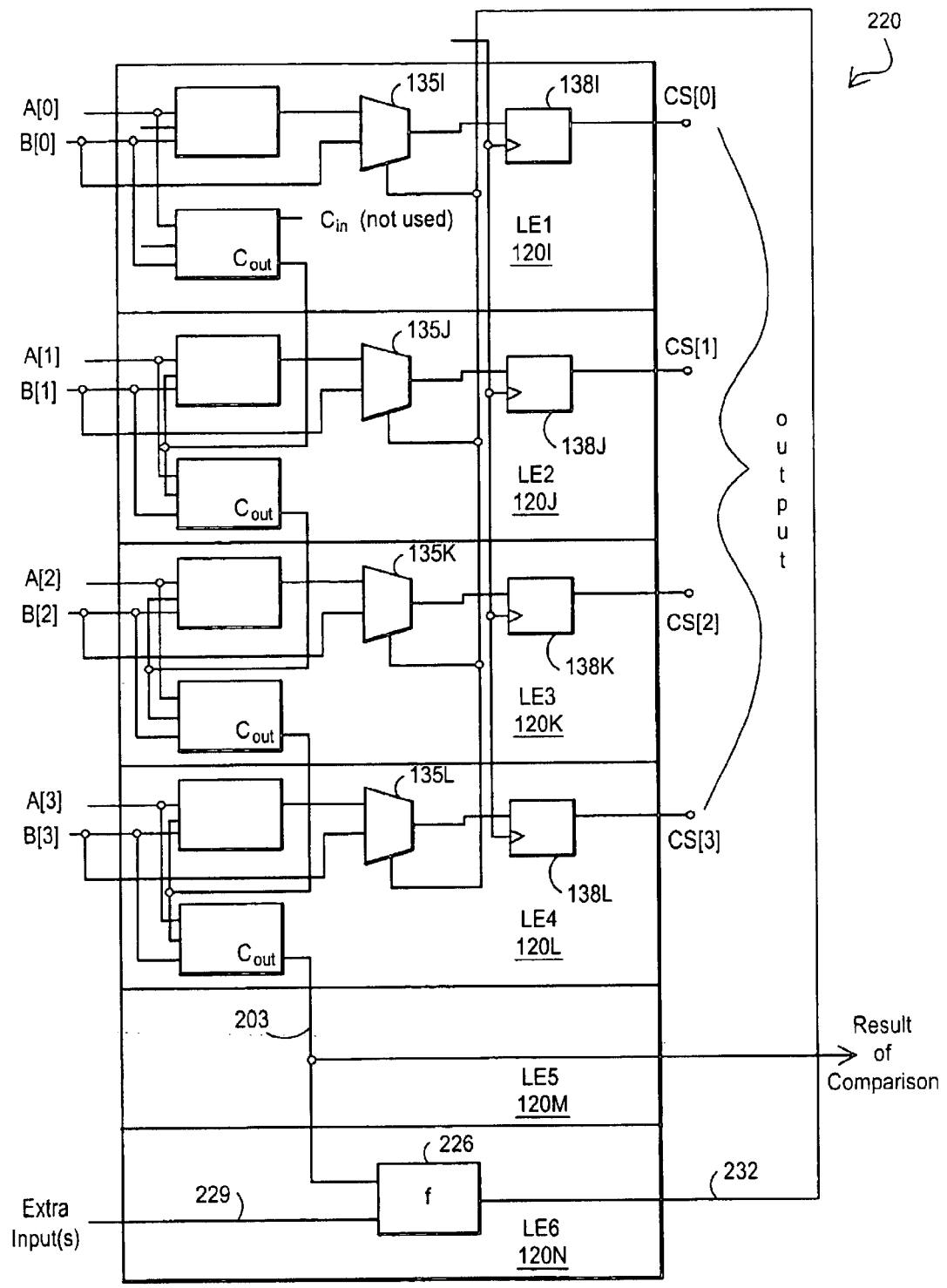
FIG. 5 illustrates a block diagram of another compare-select circuitry for use in exemplary embodiments according to the invention.

FIG. 5 illustrates a compare-select circuitry 220 for use in exemplary embodiments according to the invention. Compare-select circuitry 220 includes circuitry to extend the selection criteria to include function f. Generally, compare-select circuitry 220 has the same circuitry as compare-select circuitry 200 (see FIG. 4). In addition, compare-select circuitry 220 includes LE 120N to provide function f. More specifically, a block capable of implementing a 3-input LUT 226 in LE 120N implements functions f.

Note, however, that one may use other structure and circuitry to implement function f (and generally, other aspects or embodiments of the invention, such as compare-select circuitry 220). For example, one may use LUTs with other numbers of inputs, such as a 5-input LUT or a 6-input LUT, as desired. As another example, one may implement the function using MUXs, as desired. The choice of the specific circuitry used depends on a number of factors, such as design and performance specifications for a particular application or implementation, which fall within the knowledge of artisans with the benefit of the disclosure of the invention.

Referring to FIG. 5, it explicitly shows an enable signal 232 coupled to the enable inputs of registers 138I–138L. One may use a similar arrangement with respect to compare-select circuitry 200 in FIG. 4, as persons of ordinary skill in the art who have the benefit of the description of the invention understand.

Referring to FIG. 4, note that the Carry Out output of LE 120L serves as select signal 203 for MUXs 135I–135L. In contrast, in FIG. 5, signal 203 couples to LUT 226, as do extra input(s) 229. Extra input(s) 229 may include one or two arbitrary, desired, or prescribed inputs. Together with signal 203 (the Carry Out output of LE 120L), extra input(s) 229 constitute the inputs to LUT 226. LUT 226 provides the output of function f as select signal 232. Select signal 232 determines whether MUXs 135I–135L provide input A or input B to registers 138I–138L.

Note that compare-select circuitry 220 may provide the Carry Out output of LE 120L (signal 203, the result of comparison) to other circuitry, as desired. Furthermore, note that, as described with respect to compare-select circuitry 200, one may extend the functionality of compare-select circuitry 220 by providing an additional input C, rather than input B, to MUXs 135I–135L.

For N-bit inputs, compare-select circuitry 220 uses (N+2) LEs. In comparison, compare-select circuitry 180 of FIG. 3 employs (2N) LEs. Thus, using compare-select circuitry 220 results in the savings of (N−2) LEs. The savings in PLD resources decrease the overall system complexity and cost, while providing increased utility and functionality to the end-user.

Figure 6:
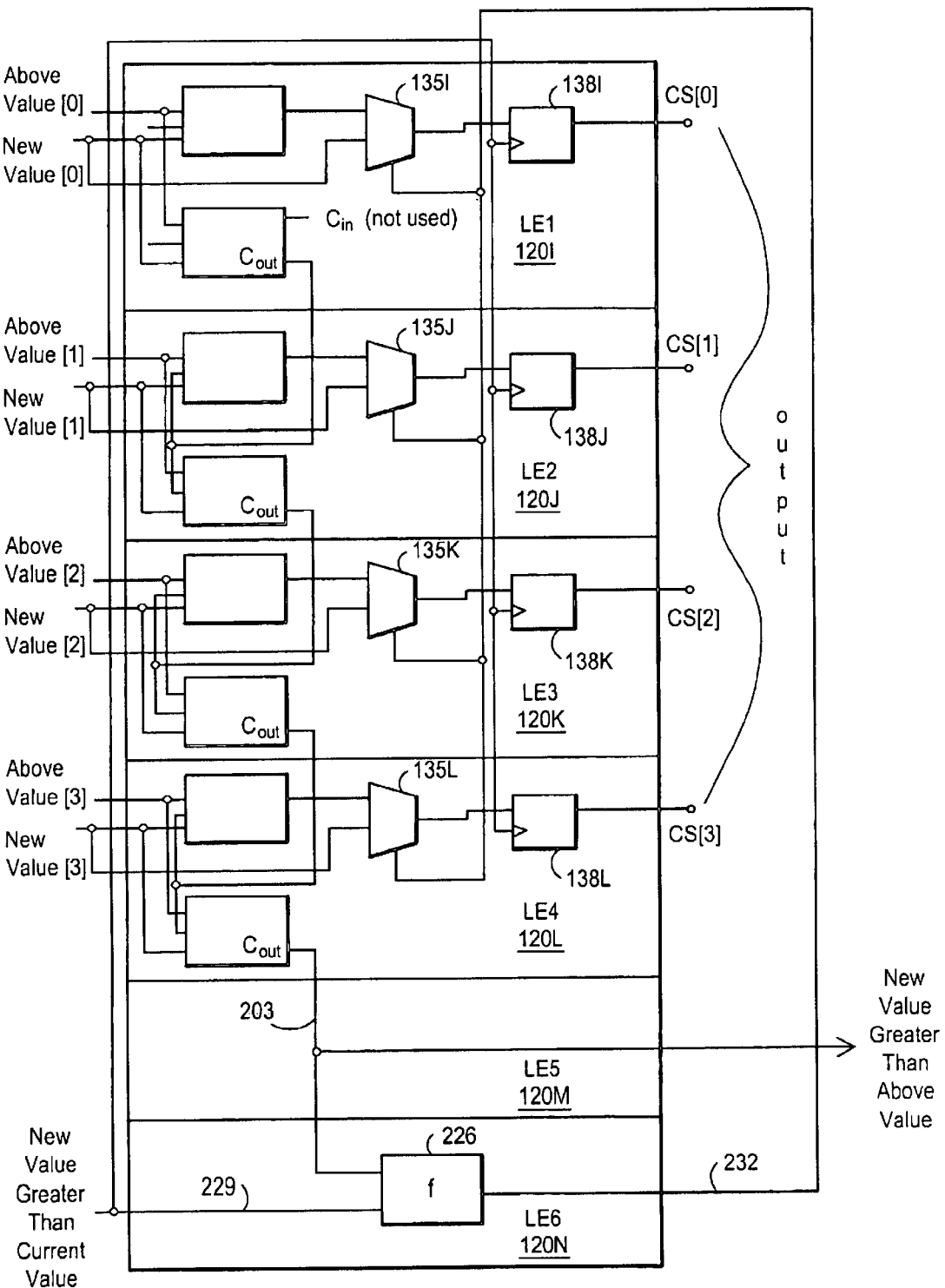
FIG. 6 depicts the compare-select circuitry of FIG. 5 used to provide insertion sorting in exemplary embodiments according to the invention

FIG. 6 shows compare-select circuitry 220 of FIG. 5 used to provide insertion sorting in exemplary embodiments according to the invention. FIG. 6 essentially shows compare-select circuitry 220, but changes the various signal names so that they correspond to signal names in an insertion-sort application. As persons skilled in the art understand, an insertion sort generally inserts a new value into an existing list of values so that the values in the resulting list either increase in ascending order (or decrease in descending order, as desired).

Referring to FIG. 6, inputs Above Value and New Value (i.e., the new value that the insertion sort circuitry inserts into the existing set of values) constitute the inputs to LEs 120I–120L. LUT 226 accepts one extra input 229, in this case, the New Value Greater Than Current Value signal. The New Value Greater Than Current Value signal also serves as the enable signal for registers 138I–138L. Signal 203 corresponds to the New Value Greater Than Above Value signal. LUT 226 implements the following Boolean function:

*f*=(New Value Greater Than Current Value) AND (New Value Not Greater Than Above Value), where the notation "AND" refers to the Boolean AND operation.

Note that the signal names in FIG. 6 correspond to an ascending sort implementation of insertion sorting. One may readily implement a descending sort by making modifications (e.g., by changing Above Value to Below Value, etc.) that fall within the knowledge of persons skilled in the art with the benefit of the description of the invention.

Insertion-sort circuitry according to the invention use the compare-select circuitry described above. One may use such insertion-sort circuitry to find medians of a set of values and to perform median filtering, as described below in detail.

Figure 7:
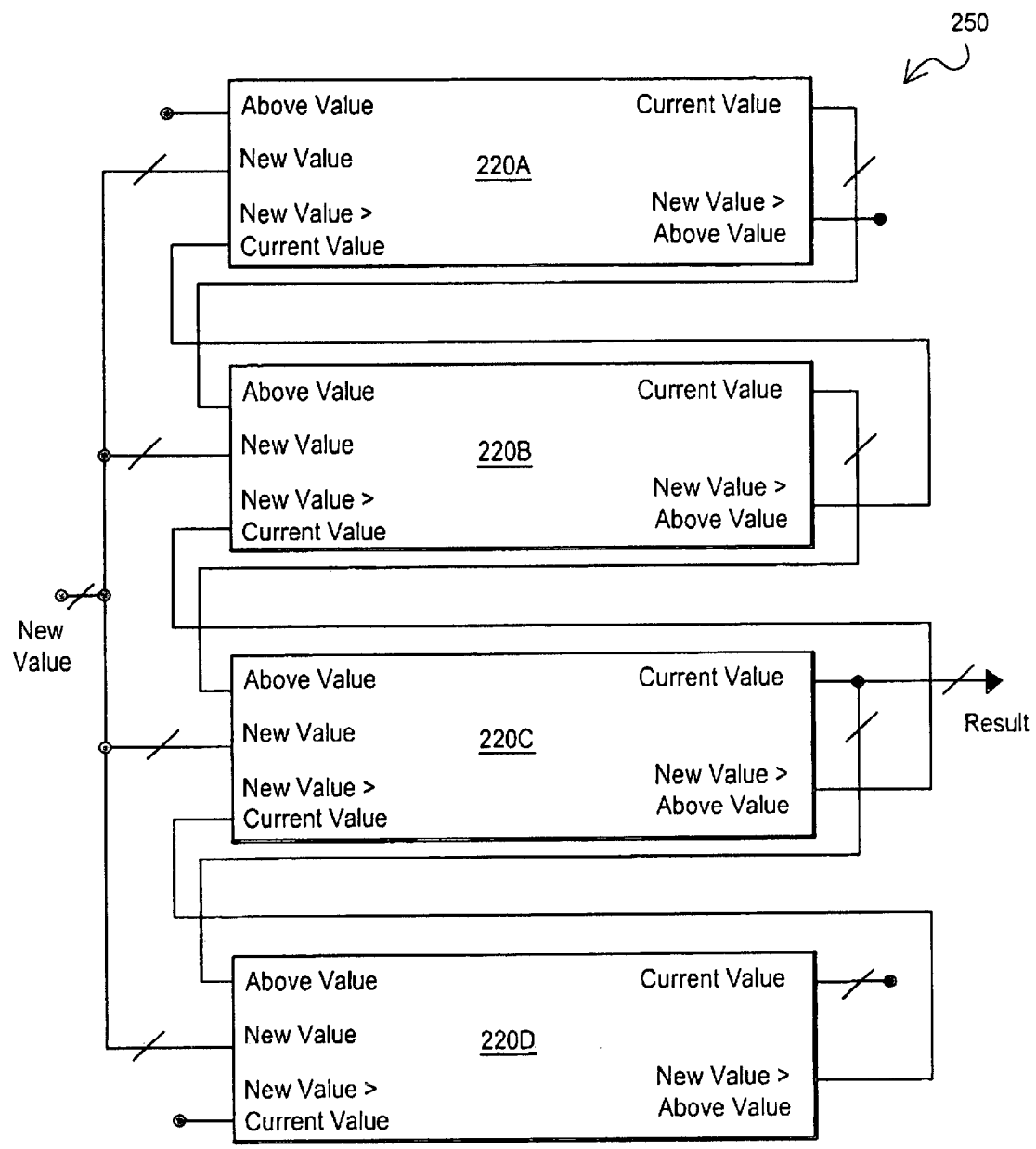
FIG. 7 shows an exemplary embodiment of an insertion-sort circuitry according to the invention.

FIG. 7 depicts an exemplary embodiment of an insertion-sort circuitry 250 according to the invention. Insertion-sort circuitry 250 includes compare-select circuitry 220A–220D. Each of compare-select circuitry 220A–220D constitutes an instance of compare-select circuitry 220, described above.

On each clock cycle, each of compare-select circuitry 220A–220D receives via its New Value input a new value from a set of n values that one seeks to insertion-sort into a set of values. Note that, before applying values to insertion-sort circuitry 250, one resets to logic 0 the registers in the compare-select circuitry 220A–220D in insertion-sort circuitry 250. The reset operation places the insertion-sort circuitry 250 in a known, initial state.

The Current Value output of each of compare-select circuitry 220A–220D includes outputs CS[0]–CS[3] of each compare-select circuitry 220A–220D. In a median-finder application (described below in detail), the Current Value output of one of the compare-select select circuitry (for a five-number example, the Current Value output of compare-select circuitry 220C) constitutes the output of insertion-sort circuitry 250.

The Current Value of each of compare-select circuitry 220A–220C feeds the Above Value of a respective succeeding compare-select circuitry. Similarly, the New Value Greater Than Current Value input of each of compare-select circuitry 220B–220D accepts the New Value Greater Than Above Value output of a respective succeeding compare-select circuitry.

Insertion-sort circuitry 250 operates as follows. On each clock cycle, a new input value arrives at compare-select circuitry 220A–220D simultaneously. The values smaller than the new value shift down to the succeeding one of compare-select circuitry 220A–220D. Insertion-sort circuitry 250 inserts the new value in the appropriate stage (i.e., one of compare-select circuitry 220A–220D) based on its value in relation to previous input values. The values greater than the input value remain in their respective stages (i.e., the respective compare-select circuitry 220A–220D).

Note that insertion-sort circuitry 250 includes some unused inputs and outputs. More specifically, the Above Value input and the New Value Greater Than Above Value output of compare-select circuitry 220A do not couple to other signals in insertion-sort circuitry 250. Similarly, the New Value Greater Than Current Value input and the Current Value output of compare-select circuitry 220D do not couple to other signals in insertion-sort circuitry 250.

Figure 8:
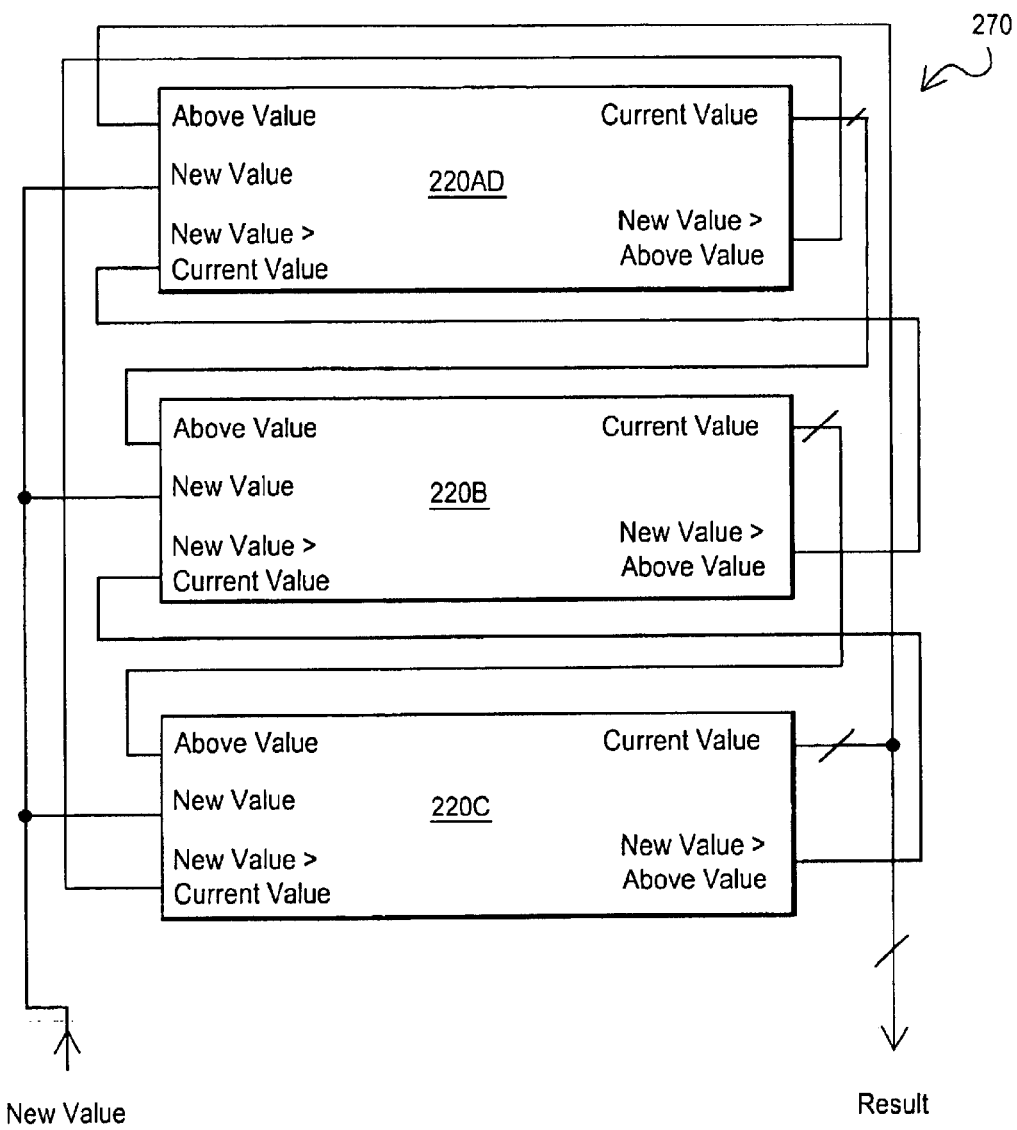
FIG. 8 illustrates an exemplary embodiment of an optimized insertion-sort circuitry according to the invention.

For median-finding applications, one may optimize insertion-sort circuitry 250 by combining its unused portions. FIG. 8 illustrates such an optimized insertion-sort circuitry 270 according to an exemplary embodiment of the invention. Insertion-sort circuitry 270 operates in a similar manner as insertion-sort circuitry 250 of FIG. 7.

Referring to FIG. 7, note that compare-select circuitry 220A need not perform a comparison because such a comparison would use a non-existent value, i.e., a value corresponding to an index of −1 (e.g., A[−1], which does not exist). Furthermore, compare-select circuitry 220D need not store a current value because that value is smaller than the mid-value of the inputs. Consequently, one may combine compare-select circuitry 220A and compare-select circuitry 220D into a single compare-select circuitry 220AD in FIG. 8.

As noted above, insertion-sort circuitry according to the invention seek to use PLD resources efficiently. As a gauge of the efficiency of resource usage, one may use the following equation to find the number of LEs for an insertion-sort circuitry that accepts n input values of N bits each:

$$M = (N+2) \cdot \lceil \frac{n}{2} \rceil,$$

where M represents the number of LEs.

Table 1 compares the quantity of LEs that insertion-sort circuitry 270 uses depending on the type of compare-select circuitry used. In Table 1, n and N refer to the number of input values and the number of bits in each value, respectively. The second and third columns provide the number of LEs in an insertion-sort circuitry that uses compare-select circuitry 180 and compare-select circuitry 220, respectively. The last column of Table 1 provides the percentage reduction in the quantity of LEs that one obtains by using compare-select circuitry 220, rather than employing compare-select circuitry 180.

TABLE 1

| n | N | Compare-Select Circuitry 180 | Compare-Select Circuitry 220 | % Reduction |
| --- | --- | --- | --- | --- |
| 5 | 4 | 24 | 17 | 29 |
| 25 | 8 | 208 | 129 | 38 |
| 125 | 32 | 4032 | 2141 | 47 |

FIGS. 7 and 8 show insertion-sort circuitry suitable for finding a median of a set of values generally and, more specifically, five values in the exemplary embodiments shown. Because the median of the set of five values occupies the third slot, one may use fewer than five compare-select circuitry to find the median. Generally, one may use this property in median-finding applications to more efficiently use PLD resources.

Note that one may use the insertion-sort circuitry according to the invention (which in turn use compare-select circuitry according to the invention) for general-purpose sorting applications, as desired. The modifications to the insertion-sort circuitry of FIGS. 7–8 to implement generalized ascending-order or descending-order sorting circuitry fall within the knowledge of persons of ordinary skill in the art who have the benefit of the description of the invention. As merely one example, in a general sorting application, one may include a larger number of compare-select circuitry (to process all of the input numbers, rather than a sufficient quantity to find the median), as desired.

Figure 9:
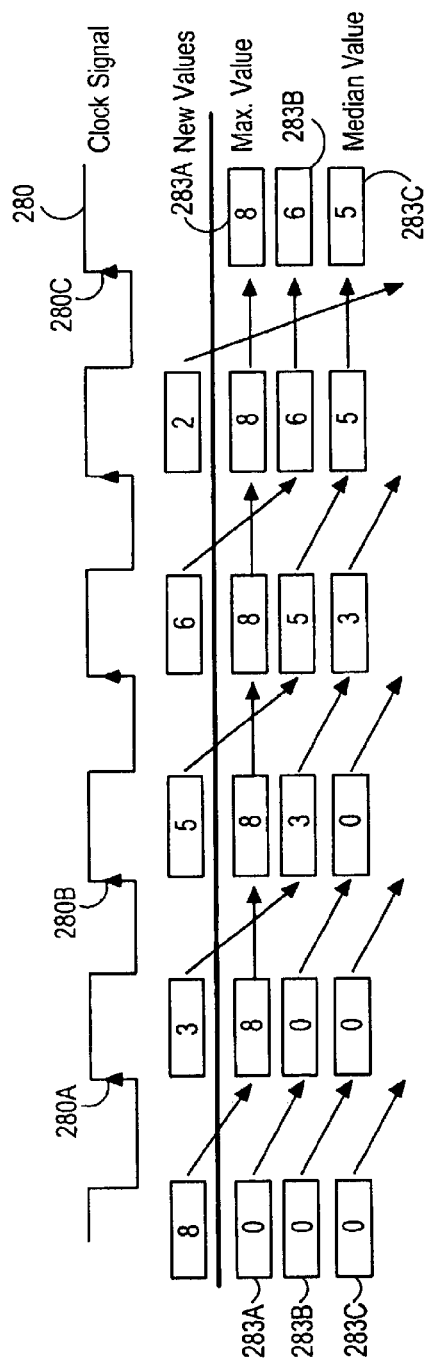
FIG. 9 shows an operation of the insertion-sort circuitry in FIG. 8 used in a median-finding application according to an exemplary embodiment of the invention.

FIG. 9 provides an illustration of the operation of insertion-sort circuitry 270 used in a median-finding application according to an exemplary embodiment of the invention. Clock signal 280 clocks insertion-sort circuitry 270 and causes signals to process and propagate through insertion-sort circuitry 270. With each rising edge of clock signal 280 (although one may readily configure the PLD to respond to falling edges, as desired), insertion-sort circuitry 270 processes a new input value.

Referring to FIG. 9, before first rising edge 280A of the clock, slots 283A–283C (corresponding to outputs of compare-select circuitry in insertion-sort circuitry 270) have a value of zero. Upon first rising clock edge 280A, insertion-sort circuitry operates on new input value 8. Because its value exceeds zero, new value 8 occupies first slot 283A. At rising clock edge 280B, insertion-sort circuitry 270 processes new value 3 and assigns it to slot 283B, the slot below the slot that input value 8 occupies.

For each new input value, insertion-sort circuitry 270 inserts the new value into the appropriate slot. Values greater than the new input value remain in their existing slots. Values smaller than the new input value shift down to succeeding slots. Note that insertion of new values into slots 283A–283C, insertion-sort circuitry 270 "pushes out" (or shifts down or discards) the smallest value in slots 283A–283C.

Upon rising clock edges subsequent to clock edge 280B, insertion-sort circuitry 270 continues to process new input values. Upon rising clock edge 280C, insertion-sort circuitry has accepted and processed five new input values (i.e., 8, 3, 5, 6, and 2). After insertion-sort circuitry 270 processes the last input value, slot 283A holds the maximum of those input values (i.e., 8), slot 283B holds the next largest value (i.e., 6), and slot 283C holds the next largest value (i.e., 5). Note that slot 283C holds the statistical median of the five input values. For the values used in the example, the median equals 5.

Note that, FIG. 9 shows merely an illustrative example of the operation of insertion-sort circuitry 270 in an exemplary embodiment according to the invention. By making modifications to insertion-sort circuitry 270, one may process other numbers of input values, sort in ascending order, etc. Those modifications fall within the knowledge of persons of ordinary skill in the art who have the benefit of the description of the invention.

As noted above, another aspect of the invention relates to using compare-select and insertion-sort circuitry as described above to implement median-filter circuitry in PLDs. In other words, median filtering constitutes one of the wide variety of applications where one may use the compare-select and insertion-sort circuitry according to the invention, described here. Generally, compare-select circuitry, insertion-sort circuitry, and median-filter circuitry according to the invention operate on blocks of numbers within an array of numbers. The array of numbers may correspond to data (i.e., pixel data) for an image, and the blocks of numbers may correspond to windows or pixel blocks within the array.

Typically, in a median-filtering application, one uses a median-filter circuitry to replace a value corresponding to a given pixel in an image with a median value. One may obtain the median by using a block or set of the pixels in the image (find the median over a selected window). For example, the set of pixels (or window) may constitute a block of j×k pixels that surround the given pixel, where j and k denote odd, positive integers. A median-filter circuitry usually performs this operation on every pixel in an image, although one may apply the procedure selectively, as desired. Note that if j or k are not odd integers, the statistical median corresponding to the block of j×k pixels will have two values. In such a situation, one may use either the lower value, the higher value, or the statistical average of the two values, as desired.

Figure 10:
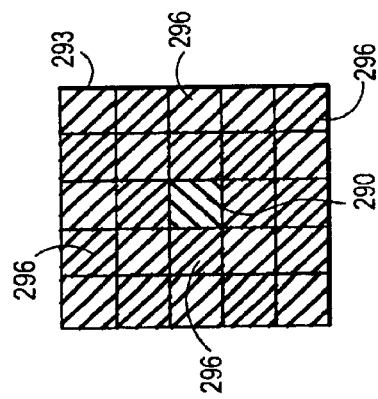
FIG. 10 illustrates a window or block of pixels used in an exemplary embodiment of the invention for median filtering of an image.

FIG. 10 illustrates a window or pixel block used in an exemplary embodiment of the invention for median filtering of an image. In this example, the median-filter circuitry performs median filtering of pixel 290 in an image (FIG. 10 does not show the entire image). The image may generally have any desired size, such as 720×480 pixels, etc. The median-filtering operation uses a set of pixels within window (or block) 293. The set of pixels includes pixel 290 and surrounding pixels 296.

In the particular example in FIG. 10, window 293 spans five pixels on each side (i.e., j=5 and k=5, thus resulting in a 5×5 window), and therefore includes 25 pixels (pixel 290, plus 24 surrounding pixels 296). Pixel 290 generally occupies the center slot in window 293, although one may use a different arrangement for corner pixels and pixels on the edges of the image. Note that, depending on the image attributes and the specifications for the median-filtering application, one may use other window dimensions (i.e., different values of j and k), as desired.

Figure 11:
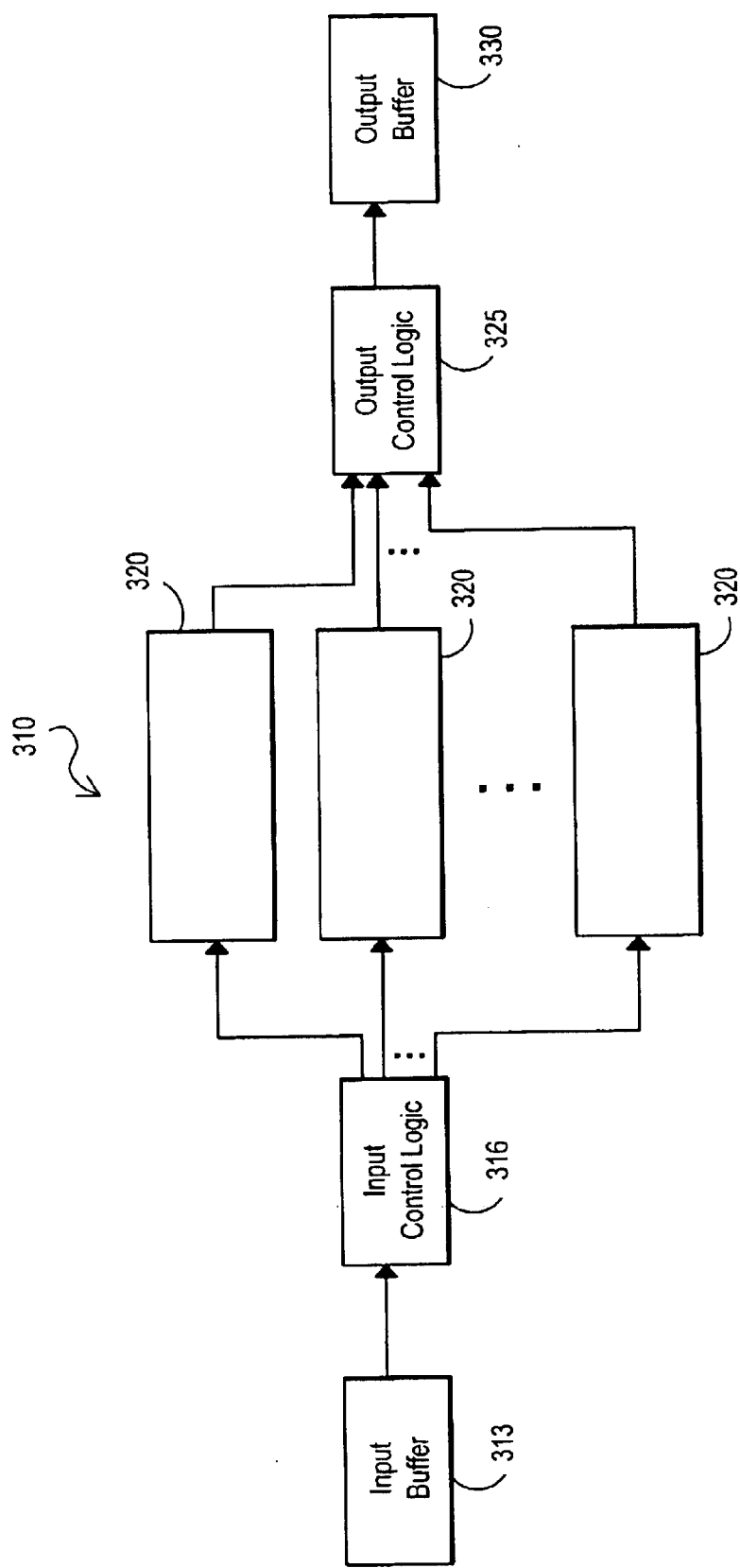
FIG. 11 illustrates an exemplary embodiment of a median-filter circuitry according to the invention.

FIG. 11 shows an exemplary embodiment 310 of a median-filter circuitry according to the invention. Embodiment 310 includes input buffer 313, input control logic 316, one or more insertion-sort circuitry 320, output control logic 325, and output buffer 330. In some exemplary embodiments, one may implement insertion-sort circuitry 320 using one or more PLDs (such as PLD 103 in FIG. 1). For example, insertion-sort circuitry 320 may constitute any of the insertion-sort circuitry described above.

Alternatively, one may use any desired insertion-sort circuitry to implement insertion-sort circuitry 320 in embodiment 310. In some embodiments according to the invention, one may use insertion-sort circuitry implemented using general logic, processors, microprocessors, state machines, microcontrollers, digital signal processors (DSP), etc., as desired. The choice of implementation of insertion-sort circuitry 320 depends on various design and performance specifications and falls within the knowledge of persons of ordinary skill in the art who have the benefit of the description of the invention. By way of illustration, the choice of insertion-sort circuitry may depend on cost, speed of operation, flexibility, programmability, ease-of-use, ease-of-configuration, and the like.

Regardless of a particular implementation of insertion-sort circuitry, input buffer 313 and input control logic 316 accept input data and provide the data points to insertion-sort circuitry 320. Insertion-sort circuitry 320 find(s) the medians of the input data and provide(s) the results to output control logic 325. More specifically, each of insertion-sort circuitry 320 (if more than one used) calculates the median value for each of the pixels for which one desires to calculate median values. In other words, more than one insertion-sort sort circuitry 320 may operate in parallel with one another to calculate the median values of a number of pixels. Output control logic 325, operating together with output buffer 330, supplies the calculated median values to other circuitry (not shown explicitly) following output buffer 330 for further processing or use, as desired.

Input buffer 313 constitutes a memory that accepts the input data and provides the data to input control logic 316. Similarly, output buffer 330 includes a memory that accepts result data from output control logic 325 and provides the data to follow-on circuitry. In embodiment 310, input buffer 313 and output buffer 330 constitute static random-access memories (SRAM). Depending on various factors, such as the desired operating speed, data throughput, cost, etc., however, one may use other circuitry to implement input buffer 313 and output buffer 330, as persons skilled in the art with the benefit of the description of the invention understand. In real-time applications, embodiment 310 may use an input buffer 313 that can process a datum on each clock cycle. In exemplary embodiments, the clock in such an application may have a frequency of 13.5 MHz, although one may use other clock rates, depending on the particular circuitry and the application, as desired.

At the beginning of operation on a set of pixels, input control logic 316 resets the first insertion-sort circuitry 320 (to place it in a known, initial state) and provides a data value (one of the pixels in a block or window of pixels) to it. Then, on each subsequent clock cycle, input control logic 316 repeats that process for a succeeding one of insertion-sort circuitry 320 (if the circuit uses more than one insertion-sort circuitry 320).

Furthermore, on each subsequent clock cycle, input control logic 316 provides an additional datum to each of the preceding insertion-sort circuitry 320 (i.e., an additional data value from the window or block of pixels corresponding to the pixel for which the particular insertion-sort circuitry 320 calculates a median value). Input control logic 316 repeats this process for each insertion-sort circuitry 320 until it has provided data values for all of the pixels for which one desires to calculate median values.

Output control logic 325 accepts the results of median calculations from insertion-sort circuitry 320. After a number of clock cycles equal to the number of insertion-sort circuitry 320 have elapsed from the provision of data to the first insertion-sort circuitry 320, output data appear at the output of the first insertion-sort circuitry 320. With subsequent clock cycles, output data also become available at the outputs of succeeding insertion-sort circuitry 320 (if the circuit uses more than one insertion-sort circuitry 320). Output control logic 325 accepts the output data from insertion-sort circuitry 320 as they become available.

The number of insertion-sort circuitry 320 in embodiment 310 depends on the number of median values one desired to calculate and the relative operating speed (clock rate) and throughput of the hardware used. For example, for a 5×5 window (see, for example, FIG. 10), one embodiment may use 25 insertion-sort circuitry 320. The desired throughput of the median-filter circuitry also impacts the number of insertion-sort circuitry 320. For instance, in the 5×5 window example, to maintain real-time data throughput of embodiment 310, one may use 25 instances of insertion-sort circuitry 320 and apply to each a clock signal with a frequency of 13.5 MHz (note that one may use other clock frequencies, depending on the particular circuitry implementation and the application, as desired).

Depending on the desired throughput, one may trade off the hardware complexity with the clocking or operation speed of the hardware. As one example, the embodiment in FIG. 11 has as many insertion-sort circuitry as the median-calculation window has pixels (in this case, 25). As another example, one may use a single insertion-sort circuitry with a correspondingly higher clock speed to maintain the desired throughput (25 times higher if one uses a 25-pixel window, for real-time data throughput).

Alternatively, one may use various other combinations of the number of insertion-sort circuitry and clocking speed, as desired. The choice of architecture depends on design and operational specifications of a particular implementation, such as the desired data throughput, as persons of ordinary skill in the art with the benefit of the description of the invention understand. The median-filter circuitry according to the invention is scalable based on clock rate, and yet can provide real-time processing with a time complexity of O(n).

Figure 12:
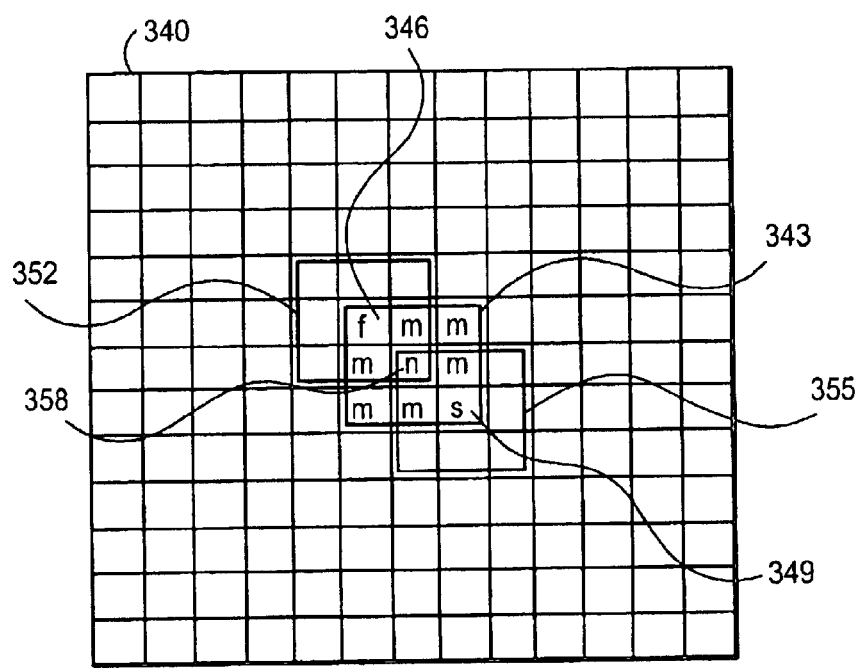
FIG. 12 depicts an example of how insertion-sort circuitry according to the invention operate on image data to perform median filtering.

FIG. 12 illustrates an example of how insertion-sort circuitry according to the invention operate on an image to perform median filtering. The particular example in FIG. 12 relates to using 3×3 windows or blocks of pixels. Persons of ordinary skill in the art who have the benefit of the description of the invention understand, however, a similar operation applies to windows with other dimensions.

Image 340 in FIG. 12 includes a number of pixels, arranged in a rectangular grid. Consider the situation where one seeks to calculate median values for the pixels within 3×3 window 343 (labeled with the letters "f," "m," "n," and "s." To calculate the median value for pixel 346 (labeled 'f'), one uses 3×3 block 352 of pixels centered around pixel 346. Similarly, the calculation of median values for other pixels in window 343 uses 3×3 blocks of surrounding pixels. For example, to calculate the median value for pixel 349 (labeled "s"), one uses 3×3 block 355 of pixels centered around pixel 349.

One may use 9 insertion-sort circuitry to simultaneously calculate the median value for each of the pixels in 3×3 window 343. Note that data values for windows corresponding to various pixels in window 343 overlap. For example, one uses pixel 358 (labeled "n") to calculate the median value for pixel 346 (labeled 'f'). Likewise, one uses pixel 358 to calculate the median value for pixel 349 (labeled "s"). Thus, some of the data used by each insertion-sort circuitry to calculate median values for each pixel in window 343 overlap.

Thus, median filtering by using a window (or block of pixels) entails operating on overlapping data that correspond to the pixels within the window. More specifically, depending on such factors as window size and the relative proximity of pixels, pixels within the window corresponding to one pixel may overlap pixels within the window for a neighboring or surrounding pixel. One may use this neighbor property or window pixel overlap property in median-filter circuitry according to various embodiments of the invention.

Figure 13:
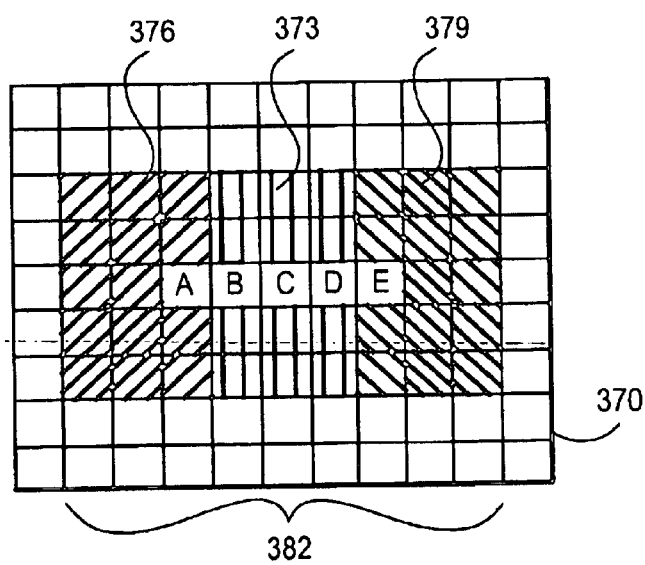
FIG. 13 shows an example of the window pixel overlap property for pixels in an image processed by exemplary embodiments of median-filter circuitry according to the invention.

FIG. 13 shows an example of the window pixel overlap property for pixels in an image 365 processed by exemplary embodiments of median-filter circuitry according to the invention. The example in FIG. 13 corresponds to a situation where one calculates the median values for 5 pixels (labeled A through E), using a 5×5 window for each of the five pixels. In other words, one calculates the median value for each pixel within image 370 by using a 5×5 window of pixels. The particular pixel for which one calculates the median value resides in the center of the corresponding 5×5 window. Thus, pixel A occupies the center of a 5×5 window that includes 25 pixels, and so on.

In addition to one or more of pixels A–E, finding the median value for each of the pixels A–E uses neighboring pixels 373 (highlighted with a vertical hatching pattern). Furthermore, one uses some or all of pixels 376 (highlighted with a lower-left to upper-right hatching pattern) to find the median values for pixels A, B, and C. Similarly, one uses some or all of pixels 379 (highlighted with an upper-left to lower-right hatching pattern) to find the median values for pixels C, D, and E.

In all, one uses 9 columns of 5 pixels (a total of 45 pixels) each to calculate the median values for pixels A–E. Because of the window pixel overlap property, calculating the median values of pixels A–E uses some of those 45 pixels more than once. One may use the window pixel overlap property to supply repeating pixels (i.e., pixels that more than one insertion-sort circuitry uses) to those insertion-sort circuitry that use them. As a consequence, one may simplify and make more efficient the design of median-filter circuitry according to the invention by using the window pixel overlap property.

Note that, although the above discussion described the window pixel overlap property with respect to a 5×5 window and five pixels (A–E), one may apply the inventive concepts to other window sizes and numbers of pixels, as desired. The modifications to the 5×5 window embodiment to implement other window sizes and numbers of pixels fall within the knowledge of persons of ordinary skill in the art who have the benefit of the description of the invention.

Figure 14:
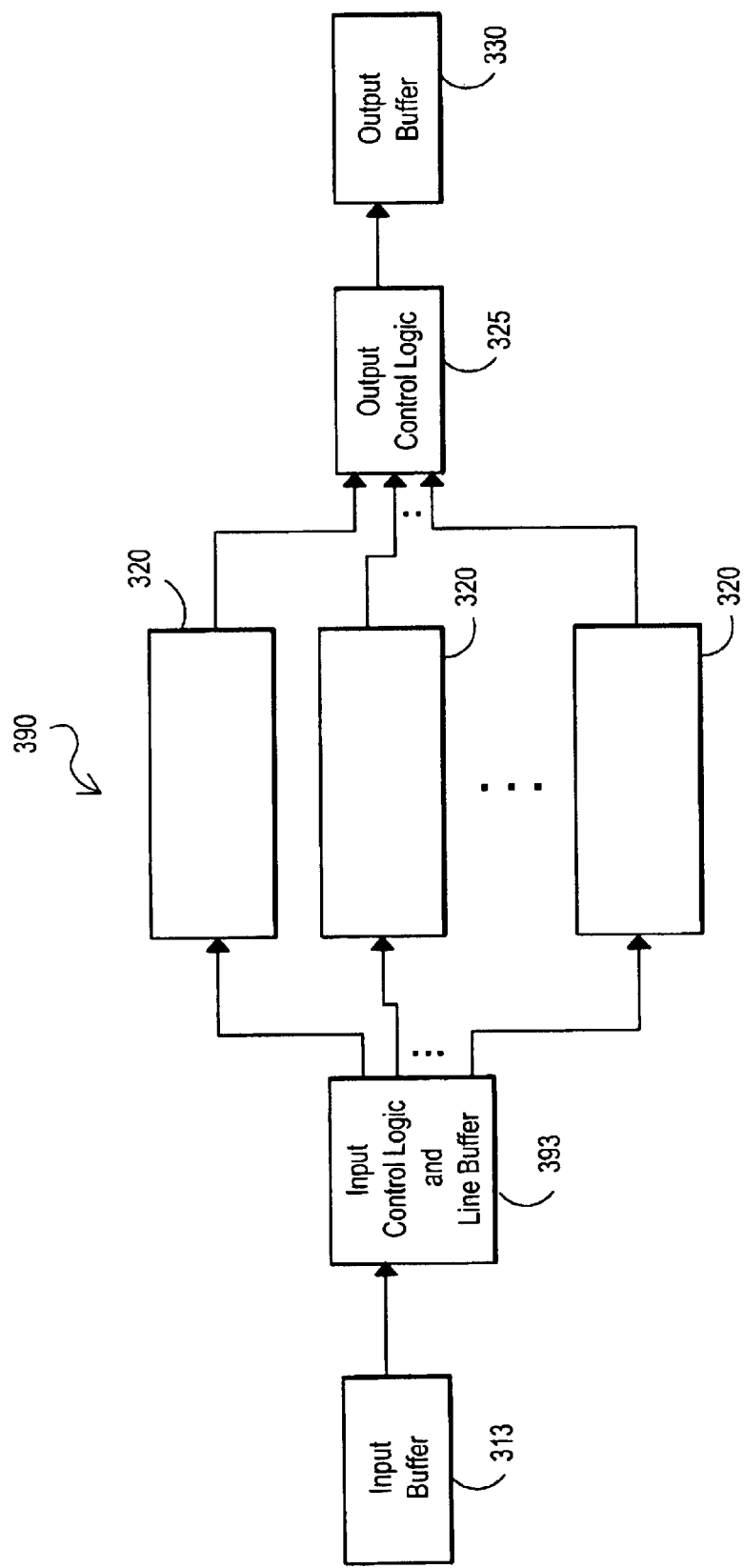
FIG. 14 illustrates an exemplary embodiment of a median-filter circuitry according to the invention.

FIG. 14 depicts an exemplary embodiment 390 of a median-filter circuitry according to the invention. FIG. 14 assumes again a 5×5 window for purposes of illustration of the concept and circuitry. Note, however, that one may extend the circuitry and inventive concepts in embodiment 390 to other window sizes, numbers of pixels, and the like, by making modifications that fall within the knowledge of persons skilled in the art with the benefit of the description of the invention.

Embodiment 390 includes input buffer 313, input control logic and line buffer 393, one or more insertion-sort circuitry 320, output control logic 325, and output buffer 330. Input buffer 313, insertion-sort circuitry 320, output control logic 325, and output buffer 330 may have a similar structure and circuitry as, and function similarly to, their counterparts in embodiment 310 in FIG. 11.

For the 5×5 window example, embodiment 390 includes 5 insertion-sort circuitry 320. Compared to embodiment 310 in FIG. 11, embodiment 390 contains only one-fifth as many insertion-sort circuitry. By taking advantage of the window pixel overlap property and time-multiplexing of insertion-sort circuitry, however, embodiment 390 can provide real-time median filtering. To do so, embodiment 390 uses a clock rate five times as high of the clock rate of embodiment 310.

More specifically, embodiment 390 uses a clock rate of 67.5 MHz (5×13.5 MHz). Put another way, for each 13.5 MHz clock cycle, each insertion-sort circuitry 320 in embodiment 390 calculates five median values by using a clock rate of 67.5 MHz (note that depending on the particular circuitry and the application, one may use other clock frequencies instead of 13.5 MHz and 67.5 MHz, as desired, and as persons skilled in the art with the benefit of the description of the invention understand). Accordingly, each insertion-sort circuitry 320 in embodiment 390 can calculate five times as many median values as a corresponding insertion-sort circuitry 320 in embodiment 310.

Note that, by using other numbers of insertion-sort circuitry 320 and corresponding clock rates, one may balance with one another factors such as cost, circuit complexity, amount of hardware, performance, throughput, etc. Thus, median-filter circuitry according to the invention provide a flexible mechanism for balancing the desired performance with the available resources. The choice of the number of insertion-sort circuitry 320 and the corresponding clock rate depends on design and performance specifications for a particular application, as persons of ordinary skill in the art who have the benefit of the description of the invention appreciate.

Figure 15:
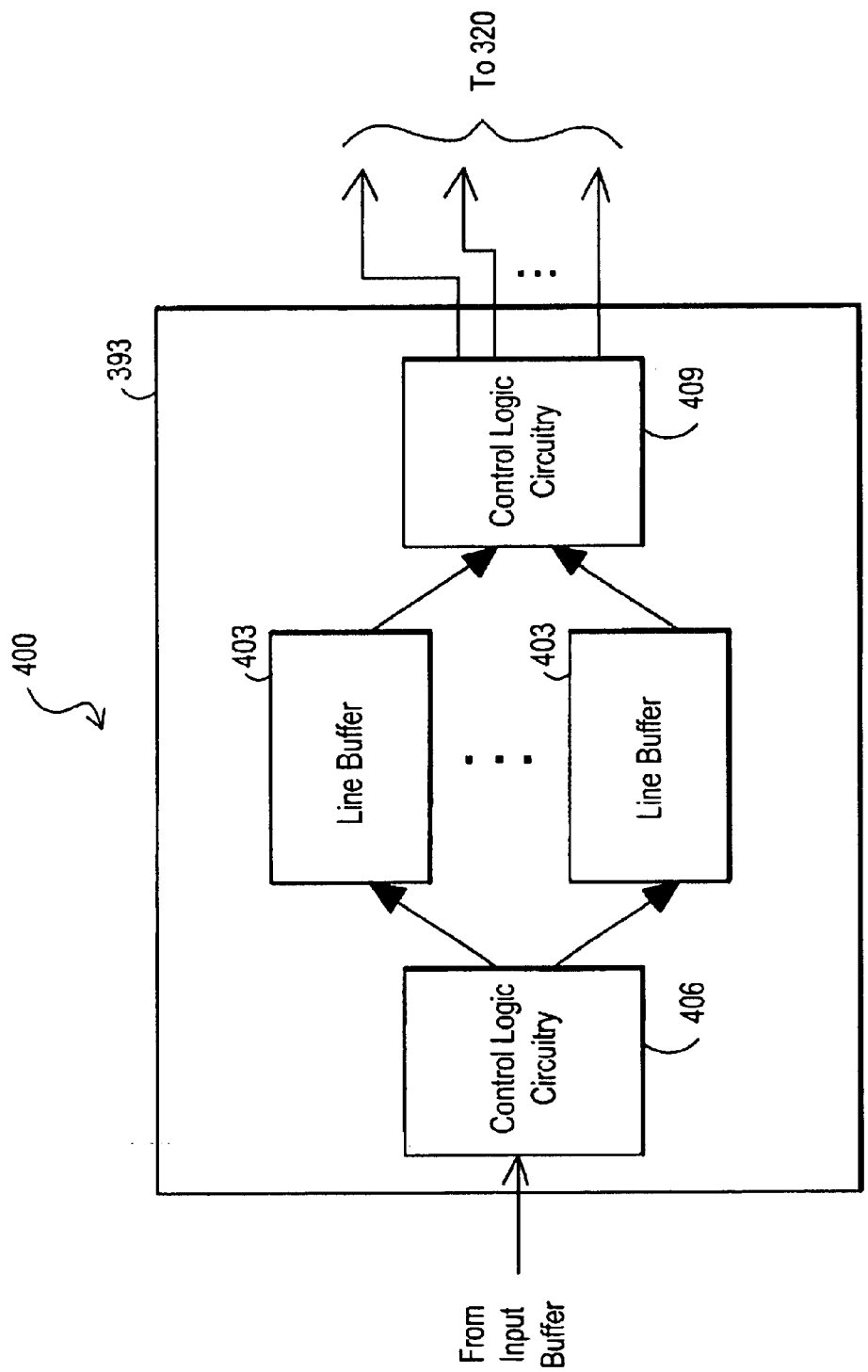
FIG. 15 depicts an exemplary embodiment of input control logic and line buffer according to the invention.

FIG. 15 shows an exemplary embodiment 400 of input control logic and line buffer 393 according to the invention. Embodiment 400 includes control logic circuitry 406, at least one line buffer 403, and control logic circuitry 409. Through control logic circuitry 406, line buffer 393 accepts data from input buffer 313 (see FIG. 14). Control logic circuitry 406 provides the input data to line buffer 403 or line buffers 403. In other words, control logic circuitry 406 causes the data from input buffer 313 to store within an appropriate line buffer 403. For example, rows 1–5 may store in the first line buffer 403, and rows 6–10 in the second line buffer 403.

Referring to FIG. 14, once insertion-sort circuitry 320 has used (or have used the data, if one uses more than one insertion-sort circuitry 320) the data in a line buffer 403, control logic circuitry 406 stores another set of data in the appropriate line buffer 403. For real-time applications, control logic circuitry 406 may run, for example, at a clock rate of 13.5 MHz. Thus, it writes data to line buffer 403 or line buffers 403 at a 13.5 M H rate (or other clock rate used, depending on the particular circuitry and application, as desired).

Line buffer(s) 403 store(s) the input data and, through control logic circuitry 409, provide the data to insertion-sort circuitry 320 (see FIG. 14). Control logic 409 directs data from line buffer 403 (or one of line buffers 403) to the appropriate one of insertion-sort circuitry 320. In each clock cycle, it provides five new pixel values, one for each of the insertion-sort circuitry 320. Note that, to take advantage of the window pixel overlap property, control logic 409 provides repeating pixels to those of insertion-sort circuitry 320 that use the repeating pixels to calculate median values for a given pixel in the input data (e.g., one of the insertion-sort circuitry 320 and those insertion-sort circuitry 320 that precede it).

Control logic circuitry 409 also restarts or resets (i.e., sets the registers in the insertion-sort circuitry 320 to an initial, known state) the insertion-sort circuitry 320 once the calculation of all 25 median values has completed. For the 5×5 window example, each insertion-sort circuitry restarts five clock cycles after the preceding insertion-sort circuitry. Note that, for real-time applications according to one embodiment of the invention, control logic circuitry 409 and insertion-sort circuitry 320 operate at a clock rate of 67.5 MHz.

In embodiment 400, line buffer 403 (or each of line buffers 403) includes multi-port memory, as described below. For the 5×5 window example, each line buffer 403 can store and provide pixels at five times the input rate (generally, for an n×n example, each line buffer 403 provides pixels at n times the input rate). The relative speed of line buffer 403 (or line buffers 403) and the window pixel overlap property may result in hardware savings. For example, because of the window pixel overlap property, for a 5×5 window, one may use two, rather than five, line buffers 403. Of course, one may use other numbers of line buffers 403 for a general n×n situation, as persons of ordinary skill in the art who have the benefit of the description of the invention understand.

More specifically, to maintain real-time processing, embodiment 390 (see FIG. 14) calculates five median values for each five new pixel values that input buffer 313 receives. As FIG. 13 shows, for a 5×5 window situation, calculating five median values uses nine unique columns of five pixels each (a total of 45 pixels). One may use two line buffers 403, each with a five-pixel height, and control logic circuitry 406 and 409 to main real-time processing. Thus, using time-multiplexing and the window pixel overlap property allows for some savings in hardware.

Figure 16:
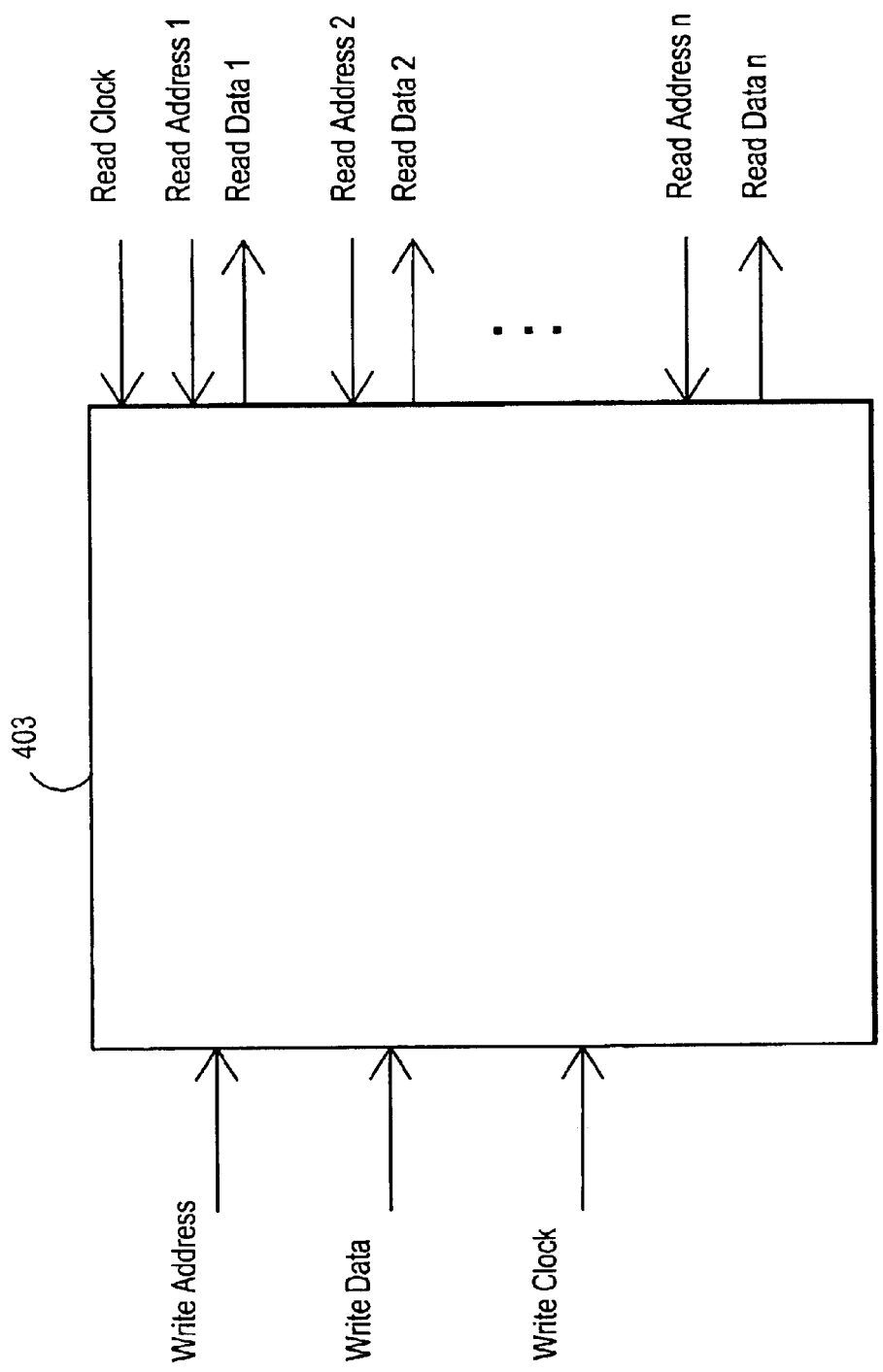
FIG. 16 shows a block diagram of an exemplary embodiment of a line buffer according to the invention.

As noted above, each line buffer 403 (see FIG. 15) may use multi-port memory. FIG. 16 illustrates a block diagram of an exemplary embodiment of line buffer 403 according to the invention. Line buffer 403 in FIG. 16 generally has a write port and n read ports. The write port accepts the write address, the write data, and the write clock, and stores the write data at the location that the write address specifies.

Each of the n read ports accepts a read address. In response to a read clock, the read port provides as read data the contents of the location that the read address specifies. For a 5×5 window example, line buffer 403 includes a write port and five read ports. Note that the write and read operations may occur at the same rate or at two different rates. Hence, the write and read clocks may have the same frequency or two different frequencies, as desired. In the exemplary embodiment for a real-time application described above, the write port uses a 13.5 MHz clock, whereas the read ports use a 67.5 MHz clock. In other words, line buffer 403 accepts a write value for each cycle of a 13.5 MHz clock and provides 25 read values for each cycle of that clock.

Figure 17:
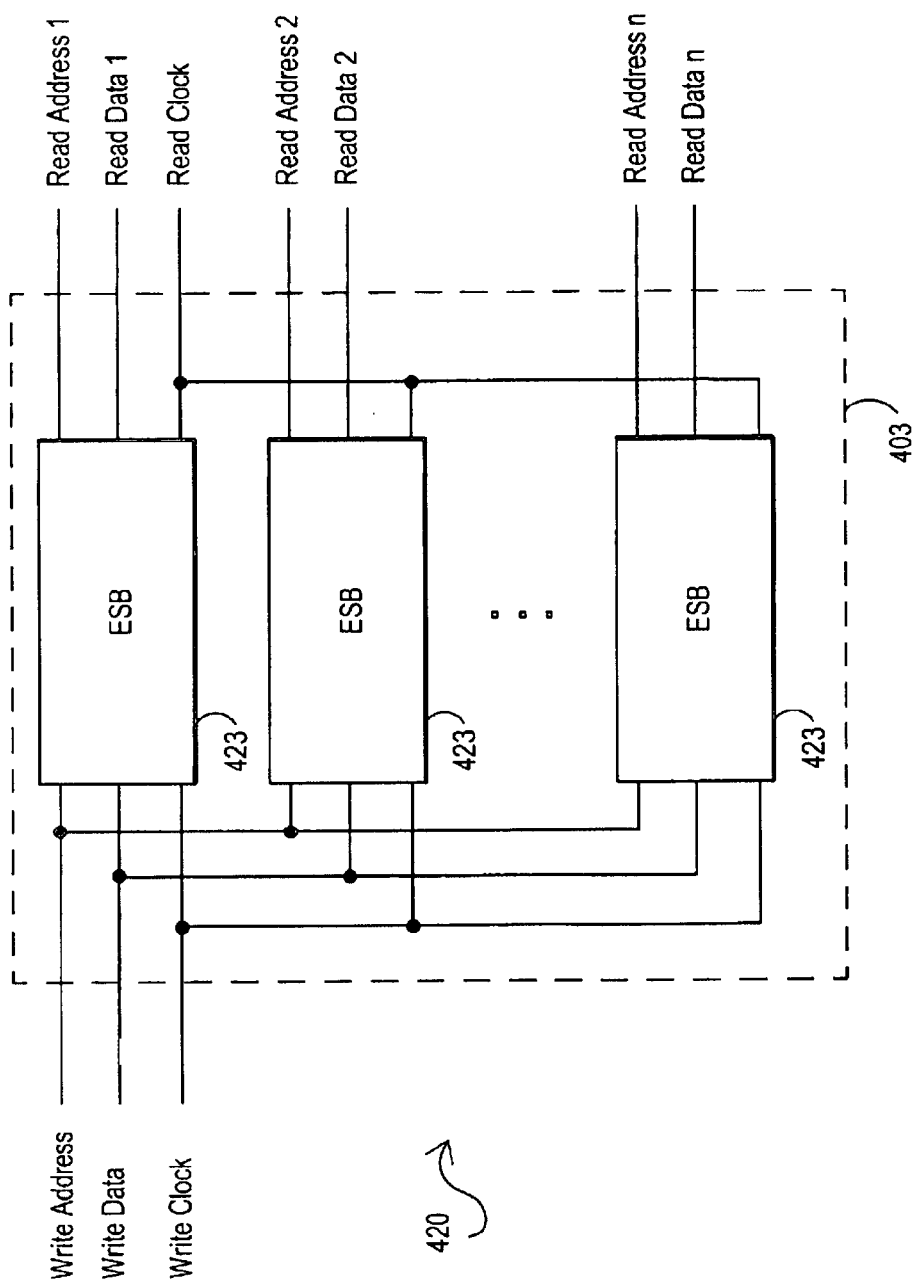
FIG. 17 illustrates an exemplary embodiment of a line buffer implementation according to the invention.

FIG. 17 depicts an exemplary embodiment 420 of a line buffer 403 according to the invention. Embodiment 420 uses blocks of memory to implement the multi-port memory in FIG. 16. Specifically, embodiment 420 implement a multi-memory by using blocks of memory, known for example as ESB, present in a PLD (e.g., PLD 103 in FIG. 1, as described above).

From a block-diagram perspective, embodiment 420 has the same input and output signals as does the multi-port memory in FIG. 16. Generally, embodiment 420 includes n ESBs 423. ESBs 423 include a dual-port mode that allows simultaneous read and write operations. Consequently, embodiment 420 has a write port and n read ports. The write port of embodiment 420 accepts the write address, the write data, and the write clock. In response to the write clock, embodiment 420 stores the write data at the location that the write address specifies. Each of the n read ports accepts a read address and, in response to a read clock, provides read data from the location corresponding to the read address. For a 5×5 window example, embodiment 420 has a write port and five read ports. The write and read clocks may have the same frequency or two different frequencies, as desired.

Embodiment 420 implements line buffer 403 using ESBs 423. (For more information on ESB, see for example the *APEX 20K Programmable Logic Device Family* data sheet referenced above.) Rather than using ESBs, one may use distributed or granular memory or other storage resources within a PLD or similar device, as desired. The implementation details of line buffers 403 within a PLD, FPGA, or other device or circuitry depends on factors such as available resources, performance, cost, and design and performance specifications for a given application, as persons skilled in the art with the benefit of the description of the invention appreciate.

Referring to FIG. 14, generally, the number of insertion-sort circuitry 320 in embodiment 390 depends on a number of factors that vary from one application to another. Those factors include the desired operating speed and throughput of the circuitry, the clock rate, cost, complexity, the available PLD resources, and the like, as persons skilled in the art who have the benefit of the description of the invention understand. Referring to FIG. 15, embodiment 400 may include a number of line buffers 403 that depend on similar factors and on the number of insertion-sort circuitry 320 in embodiment 390.

Thus, the inventive concepts provide a flexible framework for compare-select circuitry, insertion-sort circuitry, and median-filter circuitry. One may trade off cost, complexity, speed, throughput, etc., depending on the design and performance specifications for a particular application, as desired, and as persons of ordinary skill in the art who have the benefit of the description of the invention understand.

Figure 18:
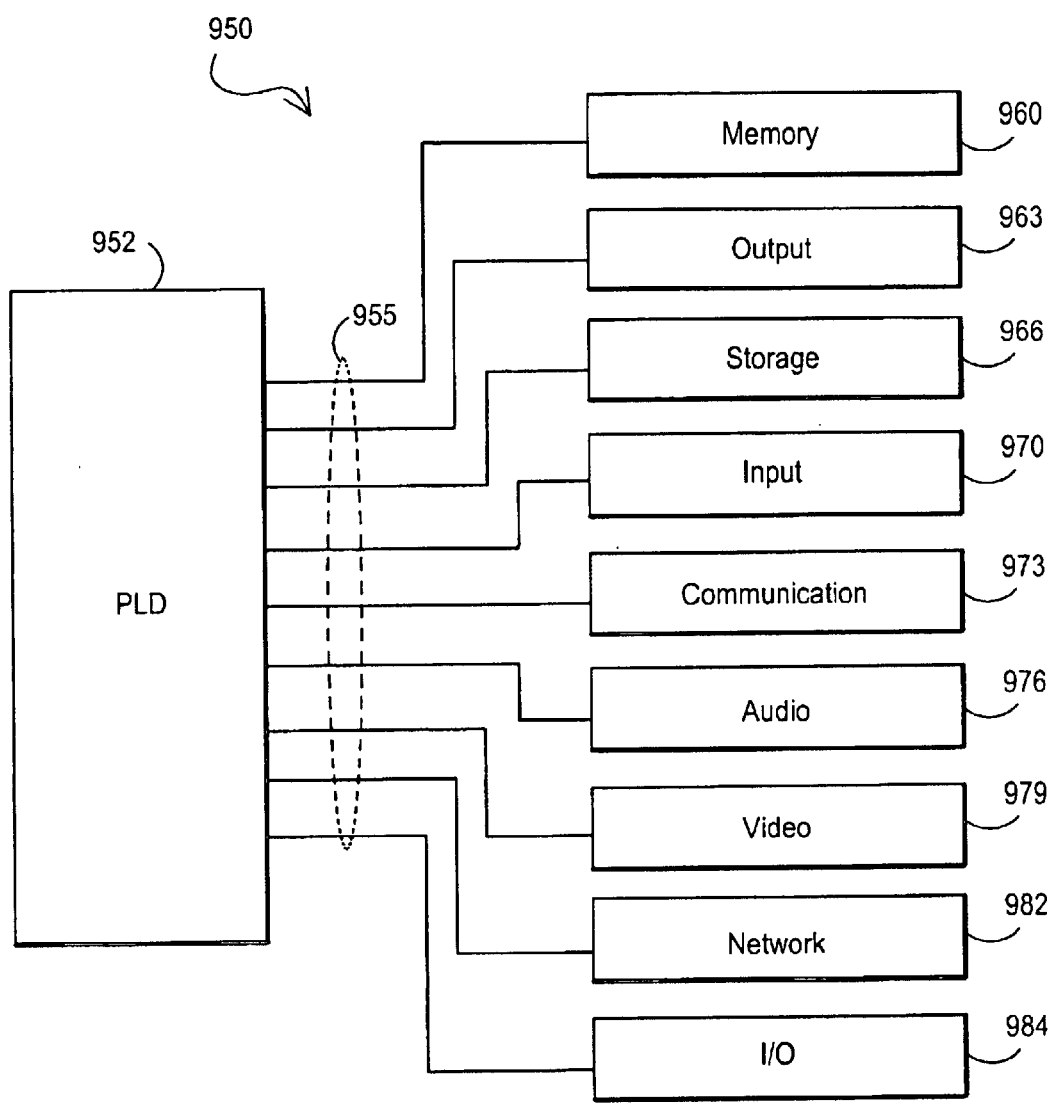
FIG. 18 depicts an illustrative embodiment of a data-processing system that includes a PLD according to the invention.

One may use PLDs according to the invention, such as those that include the circuitry described above, in a variety of data-processing systems and applications. FIG. 18 shows an illustrative embodiment 950 of a data-processing system that includes PLD 952 according to the invention (although one may include more than one PLD 952 in embodiment 950, as desired). PLD 952 may be similar to, or the same as, PLD 103 (see FIG. 1), as desired.

Embodiment 950 optionally includes a plurality of peripherals 960–984 that couple to PLD 952 via a plurality of signal links 955. Signal links 955 may constitute any suitable signal lines or a collection of a plurality of signal lines (i.e., a plurality of signal lines coupled to each of peripherals 960–984, and the collection of the plurality of signal lines constituting signal links 955). For example, signal links 955 may constitute one or more buses or other communication and coupling mechanisms, as persons of ordinary skill in the art with the benefit of the description of the invention understand. Note that embodiment 950 may exclude some of peripherals 960–984 or include a plurality of some or all of peripherals 960–984, as desired. PLD 952 may also include one or more processors (not shown explicitly), which may couple to various parts of PLD 952 and/or peripherals 960–984, as desired.

As noted above, exemplary embodiments according to the invention use LEs to implement compare-select circuitry, insertion-sort circuitry, and/or median-filter circuitry. One may use LEs that reside contiguously within a LAB. The contiguous nature of the logic elements may further facilitate more compact and efficient layout of the compare-select circuitry, insertion-sort circuitry, and/or median-filter circuitry, thus leading to more optimal designs. Note, however, that the LEs need not reside contiguously within a LAB. Furthermore, the LEs (or other suitable programmable-logic block) need not reside within a single larger block (such as a LAB), and may instead reside within more than one logic block (such as neighboring blocks), or may span several logic blocks, together with coupling and/or interconnect circuitry, as desired.

Furthermore, one may use median-filter circuitry according to the invention in a wide variety of data-processing and/or signal-processing circuitry and systems, as desired. Such circuitry and systems may include processors (such as microprocessors, DSP, microcontrollers, etc.), and a variety of peripherals (such as memory, I/O circuitry, etc. or, generally, peripherals such as peripherals 960–984 in FIG. 18), as desired. One may implement the median-filter circuitry using PLDs (or parts of PLDs) and/or other platforms and circuitry, as desired. Implementation details of such circuitry and systems fall within the knowledge of persons of ordinary skill in the art who have the benefit of the description of the invention.

The illustrative embodiments of the invention described above refer to PLDs. Note, however, that one may apply the inventive concepts effectively to circuitry known by other names in the art, such as complex programmable logic device (CPLD), programmable gate array (PGA), and field programmable gate array (FPGA), as desired. The choice of circuitry depends on the design and performance specifications for a particular application and depends on factors that fall within the knowledge of persons skilled in the art with the benefit of the description of the invention.

Although the description of the invention sometimes refers to specific sizes of inputs, windows or blocks of pixels, etc., one may apply the circuitry and inventive concepts described to a wide variety of other situations. For example, one may modify and generalize the circuitry and concepts to accommodate other sizes of the various variables, such as input sizes, window sizes, number of inputs, number of line buffers, number of insertion-sort circuitry, and the like. Furthermore, one may modify or use compare-select and/or insertion-sort circuitry according to the invention in applications other than median filtering. Those modifications fall within the knowledge of persons of ordinary skill in the art who have the benefit of the description of the invention.

Referring to the figures, the various blocks shown (for example, FIG. 11) depict mainly the conceptual functions and signal flow. The actual circuit implementation may or may not contain separately identifiable hardware for the various functional blocks. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have read the disclosure of the invention will understand.

Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only. The forms of the invention shown and described should be taken as the presently preferred embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled, in the art who have the benefit of this description of the invention may use certain features of the invention independently of the use of other features, without departing from the scope of the invention.

We claim:

1. A median-calculation apparatus, comprising at least one insertion-sort circuitry, the at least one insertion-sort circuitry configured to insertion-sort a corresponding set of input numbers to provide a corresponding sorted set of numbers, wherein each of the sorted set of numbers includes a median value of the corresponding set of input numbers, and wherein each of the at least one insertion-sort circuitry sorts the corresponding set of input numbers in response to an application of a stimulus signal, and wherein the at least one insertion-sort circuitry resides within a programmable logic device (PLD).

2. The apparatus according to claim 1, wherein each of the at least one insertion-sort circuitry includes a plurality of compare-select circuitries.

3. The apparatus according to claim 2, wherein each compare-select circuitry in the plurality of the compare-select circuitries comprises a plurality of logic elements.

4. The apparatus according to claim 3, wherein the input buffer comprises a static random-access memory (SRAM).

5. The apparatus according to claim 4, wherein the output buffer comprises a static random-access memory (SRAM).

6. The apparatus according to claim 5, wherein the stimulus signal comprises a clock signal.

7. The apparatus according to claim 6, wherein the clock signal has a frequency of 13.5 MHz.

8. A median-filter apparatus, comprising:
   a programmable logic device, including:
      at least one insertion-sort circuitry, the at least one insertion-sort circuitry configured to operate in response to a first clock signal having a first frequency,
   wherein each of the at least one insertion-sort circuitry is configured to insertion-sort a corresponding set of input numbers to provide a sorted set of numbers;
   an input controller, the input controller configured to provide to each of the at least one insertion-sort circuitry the corresponding set of input numbers; and
   an output controller, the output controller configured to accept from each of the at least one insertion-sort circuitry a median value for the corresponding set of input numbers.

9. The apparatus according to claim 8, wherein the input controller comprises:
   a first controller coupled to the at least one insertion-sort circuitry; and
   at least one line buffer coupled to the first controller.

10. The apparatus according to claim 9, wherein the first controller is configured to operate in response to the first clock signal.

11. The apparatus according to claim 10, wherein each of the at least one line buffers comprises a multi-port memory.

12. The apparatus according to claim 11, wherein each multi-port memory comprises:
at least one read port configured to operate in response to the first clock signal; and
a write port configured to operate in response to a second clock signal having a second frequency.

13. The apparatus according to claim 12, wherein each of the at least one read port of the multi-port memory couples to a corresponding one of the at least one insertion-sort circuitry.

14. The apparatus according to claim 13, wherein the input controller further comprises a second controller coupled to the write port of the multi-port memory in each of the at least one line buffer.

15. The apparatus according to claim 14, wherein the second controller is configured to operate in response to the second clock signal.

16. The apparatus according to claim 15, further comprising an input buffer coupled to the second controller, the input buffer configured to operate in response to the second clock signal.

17. The apparatus according to claim 16, further comprising an output buffer coupled to the output controller, the output buffer configured to operate in response to the second clock signal.

18. The apparatus according to claim 17, wherein the input buffer comprises a static random-access memory (SRAM).

19. The apparatus according to claim 18, wherein the output buffer comprises a static random-access memory (SRAM).

20. The apparatus according to claim 19, wherein the multi-port memory in each of the at least one line buffer comprises an embedded system block within the programmable logic device.

21. The apparatus according to claim 8, wherein the input controller is further configured to provide as part of the corresponding set of input numbers for each of the at least one insertion-sort circuitry a set of numbers derived from overlapping blocks of numbers within the array of numbers.

22. The apparatus according to claim 21, included within a data-processing system.

23. The apparatus according to claim 21, wherein the array of numbers comprises image data.

24. The apparatus according to claim 23, wherein the first frequency is 67.5 MHz.

25. The apparatus according to claim 24, wherein the second frequency is 13.5 MHz.

26. A method of processing numbers, comprising:
accepting at least one set of input numbers;
using at least one insertion-sort circuitry to insertion-sort a corresponding set in the at least one set of input numbers and to generate a corresponding sorted set of numbers;
using an input controller to supply to each of the at least one insertion-sort circuitry the corresponding set of input numbers; and
using an output controller to accept from each of the at least one insertion-sort circuitry the median value of the corresponding insertion-sorted numbers;
wherein each of the sorted set of numbers includes a median value of the corresponding set of input numbers.

27. The method according to claim 26, wherein the at least one insertion-sort circuitry is implemented within a programmable logic device (PLD).

28. The method according to claim 27, wherein each of the at least one insertion-sort circuitry is implemented as a plurality of compare-select circuitries.

29. The method according to claim 28, wherein each compare-select circuitry in the plurality of the compare-select circuitries is implemented as a plurality of logic elements.

30. The method according to claim 29, wherein the stimulus signal comprises a clock signal.

31. A method of median filtering an array of numbers, comprising:
using at least one insertion-sort circuitry adapted for insertion-sorting a corresponding set of input numbers within the array of numbers to provide a sorted set of numbers;
wherein the at least one insertion-sort circuitry is configured to operate in response to a first clock signal having a first frequency; and
wherein each of the at least one insertion-sort circuitry is implemented in a programmable logic device (PLD);
using an input controller to provide to each of the at least one insertion-sort circuitry the corresponding set of input numbers; and
using an output controller to accept from each of the at least one insertion-sort circuitry a median value for the corresponding set of input numbers, wherein the output controller is operable in response to a second clock signal having a second frequency.

32. The method according to claim 31, further comprising providing to each of the at least one insertion-sort circuitry the corresponding set of input numbers at a rate that corresponds to the first frequency.

33. The method according to claim 32, wherein the set of input numbers for each of the at least one insertion-sort circuitry comprises a block of numbers within the array of numbers.

34. The method according to claim 33, further comprising using the input controller to provide as part of the corresponding set of input numbers for each of the at least one insertion-sort circuitry a set of numbers derived from overlapping blocks of numbers within the array of numbers.

35. The method according to claim 34, wherein the array of numbers comprises image data.

36. The method according to claim 35, wherein the first frequency is 67.5 MHz.

37. The method according to claim 36, wherein the second frequency is 13.5 MHz.

38. The method according to claim 34, wherein each of the at least one insertion-sort circuitry includes a plurality of compare-select circuitries.

39. The method according to claim 38, wherein each of the plurality of compare-select circuitries includes a plurality of logic elements within the programmable logic device.

* * * * *